(12) United States Patent
Sugaya et al.

(10) Patent No.: US 11,831,299 B2
(45) Date of Patent: Nov. 28, 2023

(54) HIGH-FREQUENCY MODULE AND COMMUNICATION DEVICE

(71) Applicant: Murata Manufacturing Co., Ltd., Nagaokakyo (JP)

(72) Inventors: Yukiteru Sugaya, Nagaokakyo (JP); Syunsuke Kido, Nagaokakyo (JP); Masanori Kato, Nagaokakyo (JP); Hiroshi Matsubara, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 61 days.

(21) Appl. No.: 17/221,014

(22) Filed: Apr. 2, 2021

(65) Prior Publication Data

US 2021/0313962 A1   Oct. 7, 2021

(30) Foreign Application Priority Data

Apr. 3, 2020 (JP) ................. 2020-067939

(51) Int. Cl.
  *H03H 9/54* (2006.01)
  *H03H 9/205* (2006.01)
  *H03H 9/60* (2006.01)

(52) U.S. Cl.
  CPC ........... *H03H 9/542* (2013.01); *H03H 9/205* (2013.01); *H03H 9/605* (2013.01)

(58) Field of Classification Search
  CPC ......... H03H 9/542; H03H 9/205; H03H 9/605
  See application file for complete search history.

(56) References Cited

U.S. PATENT DOCUMENTS

| 7,301,420 B2* | 11/2007 | Yamaguchi | H03H 9/6483 333/133 |
| 7,755,453 B2* | 7/2010 | Iwaki | H03H 9/706 333/133 |
| 8,648,670 B2* | 2/2014 | Hara | H03H 9/706 333/195 |
| 2005/0264375 A1* | 12/2005 | Ikuta | H03H 9/725 333/195 |

(Continued)

FOREIGN PATENT DOCUMENTS

| CN | 101953070 A | 1/2011 |
| CN | 102055430 A | 5/2011 |

(Continued)

OTHER PUBLICATIONS

Official Communication issued in corresponding Chinese Patent Application No. 202110341011.6, dated Mar. 31, 2022.

(Continued)

*Primary Examiner* — Ryan Jager
(74) *Attorney, Agent, or Firm* — KEATING & BENNETT, LLP

(57) ABSTRACT

A high-frequency module includes a mounting substrate, a filter, and a common inductor. The mounting substrate includes a first main surface and a second main surface facing each other. The filter includes series arm resonators and parallel arm resonators, and is disposed on the first main surface. The mounting substrate includes a ground terminal on the second main surface. A first end of the common inductor is connected to all of the parallel arm resonators. A second end of the common inductor is connected to the ground terminal.

24 Claims, 20 Drawing Sheets

(56) References Cited

U.S. PATENT DOCUMENTS

| | | | |
|---|---|---|---|
| 2010/0188166 A1 | 7/2010 | Hara et al. | |
| 2010/0319975 A1* | 12/2010 | Tsutsumi | H03H 9/0576 |
| | | | 174/260 |
| 2015/0220665 A1* | 8/2015 | Turner | G06F 30/36 |
| | | | 716/103 |
| 2017/0194939 A1* | 7/2017 | Mukai | H03H 9/0576 |

FOREIGN PATENT DOCUMENTS

| | | |
|---|---|---|
| CN | 108242582 A | 7/2018 |
| WO | WO 2007088683 A1 * | 8/2007 |
| WO | 2016/056377 A1 | 4/2016 |

OTHER PUBLICATIONS

Office Action in CN202110341011.6, dated Oct. 20, 2022, 11 pages.

\* cited by examiner

HIGH-FREQUENCY MODULE AND COMMUNICATION DEVICE

CROSS REFERENCE TO RELATED APPLICATIONS

This application claims the benefit of priority to Japanese Patent Application No. 2020-067939 filed on Apr. 3, 2020. The entire contents of this application are hereby incorporated herein by reference.

BACKGROUND OF THE INVENTION

1. Field of the Invention

The present invention relates to a high-frequency module and a communication device, and more particularly, to a high-frequency module and a communication device including a mounting substrate and a filter.

2. Description of the Related Art

In the past, a branching device including a first filter chip and a second filter chip has been known (see, for example, International Publication No. 2016/056377).

The branching device disclosed in International Publication No. 2016/056377 is a triplexer including a duplexer and a filter. The first filter chip includes the duplexer. The second filter chip includes the filter.

International Publication No. 2016/056377 discloses a schematic arrangement of the first filter chip and the second filter chip mounted on a circuit board.

In a high-frequency module, when a mounting substrate and a filter mounted on the mounting substrate are provided, filter characteristics of the filter may be deteriorated.

SUMMARY OF THE INVENTION

Preferred embodiments of the present invention provide high-frequency modules and communication devices each having improved filter characteristics.

A high-frequency module according to a preferred embodiment of the present invention includes a mounting substrate, a filter, and a common inductor. The mounting substrate includes a first main surface and a second main surface facing each other. The filter includes a plurality of series arm resonators and a plurality of parallel arm resonators, and is disposed on the first main surface. The mounting substrate includes a ground terminal on the second main surface. A first end of the common inductor is connected to all of the plurality of parallel arm resonators, and a second end of the common inductor is connected to the ground terminal.

A high-frequency module according to a preferred embodiment of the present invention includes a mounting substrate and a filter. The mounting substrate includes a first main surface and a second main surface facing each other. The filter includes a first input/output terminal, a second input/output terminal, and a plurality of ground terminals, and is disposed on the first main surface of the mounting substrate. The mounting substrate includes a ground terminal on the second main surface, and includes a via conductor extending between the first main surface and the second main surface. A first end of the via conductor is connected to all of the plurality of ground terminals, and a second end of the via conductor is connected to the ground terminal.

A communication device according to a preferred embodiment of the present invention includes a high-frequency module according to a preferred embodiment of the present invention, and a signal processing circuit that processes a high-frequency signal passing through the high-frequency module.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
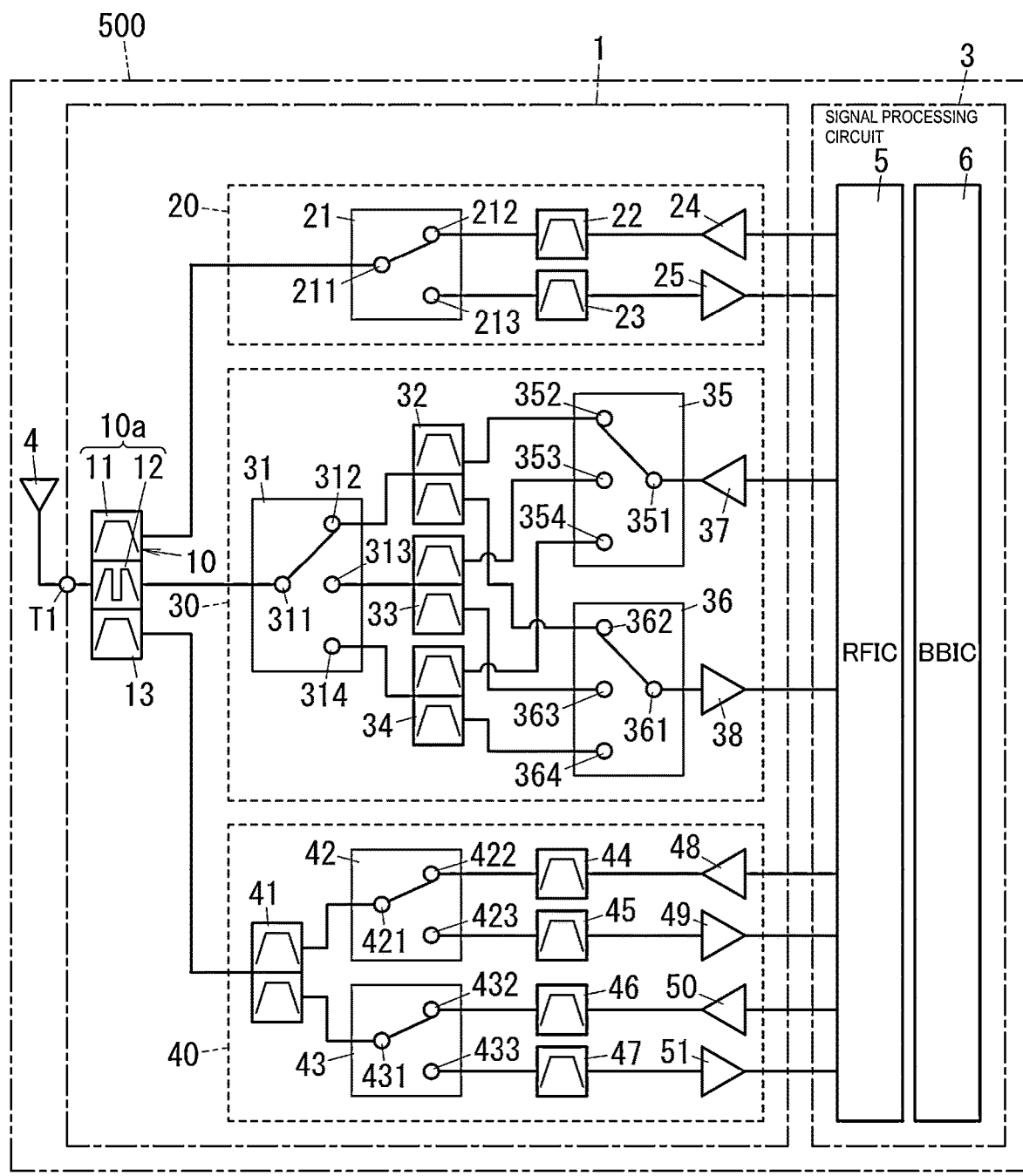
FIG. 1 is a schematic circuit diagram of a high-frequency module and a communication device according to Preferred Embodiment 1 of the present invention.

Preferred embodiments of the present invention will be described in detail below with reference to the accompanying drawings.

FIG. 1 to FIG. 29 referred to in the following preferred embodiments and the like are schematic views, and ratios of sizes and thicknesses of respective components in the drawings do not necessarily reflect an actual dimensional ratio.

Preferred Embodiment 1

Hereinafter, a high-frequency module 1 and a communication device 500 according to Preferred Embodiment 1 of the present invention will be described with reference to FIG. 1 to FIG. 5.

1. OVERALL CONFIGURATION OF HIGH-FREQUENCY MODULE

The high-frequency module 1 according to the present preferred embodiment is used, for example, in the communication device 500 supporting a multimode/multi-band.

The communication device 500 is, for example, a mobile phone (for example, a smartphone), but is not limited thereto, and may be, for example, a wearable terminal (for example, a smartwatch) or the like. The high-frequency module 1 is capable of supporting, for example, a 4G (fourth generation mobile communication) standard, a 5G (fifth generation mobile communication) standard, and the like. The 4G standard is, for example, a 3GPP long term evolution (LTE) standard. The 5G standard is, for example, a 5G new radio (NR) standard. The high-frequency module 1 is capable of supporting carrier aggregation and dual connectivity.

Further, the high-frequency module 1 is capable of supporting Wi-Fi (registered trademark) communication.

The high-frequency module 1 is, for example, configured to amplify a transmission signal inputted from a signal processing circuit 3 and output the amplified transmission signal to an antenna 4. Further, the high-frequency module 1 is configured to amplify a reception signal inputted from the antenna 4 and output the amplified signal to the signal processing circuit 3. The signal processing circuit 3 is not a component of the high-frequency module 1, but is a component of the communication device 500 including the high-frequency module 1. The high-frequency module 1 according to the present preferred embodiment is, for example, controlled by the signal processing circuit 3 included in the communication device 500. The communication device 500 includes the high-frequency module 1 and the signal processing circuit 3. The communication device 500 further includes the antenna 4. The signal processing circuit 3 processes a signal (reception signal) received with the antenna 4 interposed therebetween, and a signal (transmission signal) transmitted with the antenna 4 interposed therebetween.

2. EACH COMPONENT OF HIGH-FREQUENCY MODULE

Hereinafter, each component of the high-frequency module 1 according to the present preferred embodiment will be described with reference to the drawings.

Figure 3:
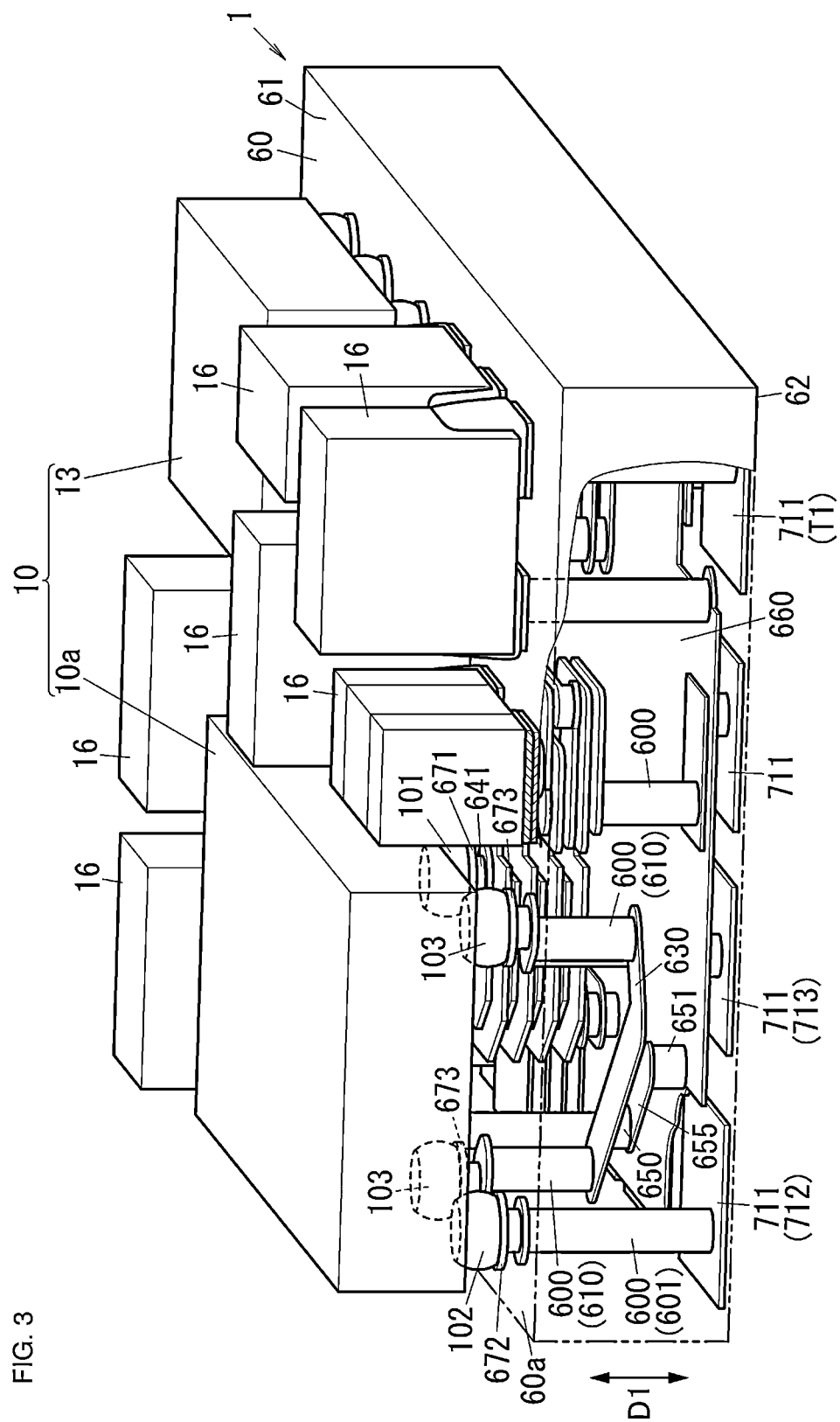
FIG. 3 is a diagram of a mounting substrate on which the first filter of FIG. 2 is mounted.

As illustrated in FIG. 1 and FIG. 3, the high-frequency module 1 according to the present preferred embodiment includes a filter 10, a first processing unit 20, a second processing unit 30, a third processing unit 40, and a mounting substrate 60. Note that, the mounting substrate 60 includes an antenna terminal T1.

As illustrated in FIG. 1, the antenna terminal T1 is electrically connected to the antenna 4.

The filter 10 is a multiplexer. In the present preferred embodiment, the filter 10 includes three filters (a first filter 11, a second filter 12, and a third filter 13) (see FIG. 1). Each of the first filter 11, the second filter 12, and the third filter 13 is, for example, an acoustic wave filter, and each of a plurality of series arm resonators and a plurality of parallel arm resonators is defined by an acoustic wave resonator. An acoustic wave filter is, for example, a surface acoustic wave (SAW) filter that utilizes a surface acoustic wave. Note that, the first filter 11, the second filter 12, and the third filter 13 are not limited to the SAW filters. A plurality of filters may be, for example, bulk acoustic wave (BAW) filters, rather than SAW filters. Alternatively, each of the first filter 11, the second filter 12, and the third filter 13 may include a film bulk acoustic resonator (FBAR) or the like, for example. Further, each of the first filter 11, the second filter 12, and the third filter 13 may be defined by an LC resonance circuit or the like, for example. In the present preferred embodiment, the first filter 11 and the second filter 12 define a filter device 10a provided as one chip (see FIG. 1 and FIG. 3).

The first filter 11 is connected to the first processing unit 20. The second filter 12 is connected to the second processing unit 30. The third filter 13 is connected to the third processing unit 40.

The first filter 11 includes a band pass filter having a predetermined pass band. In the present preferred embodiment, the first filter 11 allows a signal in a frequency band for Wi-Fi communication to pass therethrough. For example, the predetermined pass band corresponds to a frequency band in a 2.4 GHz band for the Wi-Fi communication. That is, the first filter 11 allows a signal in the 2.4 GHz band to pass therethrough. The frequency band of the 2.4 GHz band ranges from about 2.400 GHz to about 2.483 GHz.

The second filter 12 is a mid-band filter having a pass band on a lower frequency side of the above predetermined pass band, a mid-band filter having a pass band on a higher frequency side of the above predetermined pass band, or a mid-band filter having both a pass band on a lower frequency side of the above predetermined pass band and a pass band on a higher frequency side of the above predetermined pass band. In other words, the second filter 12 has a pass band on at least one of a higher frequency side and a lower frequency side of the above predetermined pass band.

In the present preferred embodiment, the second filter 12 allows a signal in a frequency band of the LTE standard, or a signal at a frequency in a frequency band of the 5G standard to pass therethrough. In the present preferred embodiment, as the frequency bands of the LTE standard, for example, Band 3, Band 40, and Band 41 are preferably used. That is, the second filter 12 allows each of a signal in Band 3, a signal in Band 40, and a signal in Band 41 to pass therethrough. Here, a frequency band of Band 3 is about 1.8 GHz, a frequency band of Band 40 is about 2.3 GHz, and a frequency band of Band 41 is about 2.5 GHz. Thus, the frequency band for the Wi-Fi communication exists between Band 40 and Band 41. Thus, the second filter 12 is configured such that a signal in the frequency band for the Wi-Fi communication does not pass therethrough.

The third filter 13 has an ultra-high band (UHB) as a pass band. That is, the third filter is an ultra-high band (UHB) filter having a pass band on a higher frequency side of both the above predetermined pass band and the pass band of the second filter.

In the present preferred embodiment, the third filter 13 allows a signal in a frequency band of the UHB to pass therethrough. In the present preferred embodiment, as the frequency bands of the UHB, for example, Band 42 (about 3.5 GHz band) and Band 52 (about 3.3 GHz band) are preferably used. That is, the third filter 13 allows a signal in Band 42 and a signal in Band 52 to pass therethrough.

The first processing unit 20 includes a first switch 21, filters 22, 23, a power amplifier 24, and a low-noise amplifier 25.

As illustrated in FIG. 1, the first switch 21 includes a common terminal 211, and a plurality of (two in the illustrated example) selection terminals 212 and 213. The common terminal 211 is electrically connected to the first filter 11. The selection terminal 212 is electrically connected to the filter 22. The selection terminal 213 is electrically connected to the filter 23.

The first switch 21 is capable of selecting one selection terminal of the selection terminals 212 and 213 as a connection destination of the common terminal 211. That is, the first switch 21 is capable of selectively connecting the filter 22 or the filter 23 to the first filter 11.

The first switch 21 is controlled by, for example, the signal processing circuit 3. The first switch 21, in accordance with a control signal from an RF signal processing circuit 5 of the signal processing circuit 3, electrically connects one selection terminal of the selection terminal 212 and the selection terminal 213 to the common terminal 211.

Each of the filters 22 and 23 is, for example, an acoustic wave filter, and each of a plurality of series arm resonators and a plurality of parallel arm resonators is defined by an acoustic wave resonator. The acoustic wave filter is, for example, a SAW filter that utilizes a surface acoustic wave. Note that, the filters 22 and 23 are not limited to the SAW filters. The filters 22 and 23 may be, for example, BAW filters rather than the SAW filters. Alternatively, the filters 22 and 23 may each include an FBAR or the like, for example. Further, the filters 22 and 23 may each be defined by an LC resonance circuit or the like, for example.

The filter 22 allows a signal (transmission signal) transmitted from the antenna 4 with the Wi-Fi communication to pass therethrough. The filter 23 allows a signal (reception signal) received by the antenna 4 with the Wi-Fi communication to pass therethrough.

The power amplifier 24 amplifies a signal (transmission signal) transmitted from the antenna 4. An input terminal of the power amplifier 24 is electrically connected to the signal processing circuit 3. An output terminal of the power amplifier 24 is electrically connected to the filter 22. The power amplifier 24 amplifies a signal outputted from the signal processing circuit 3. The power amplifier 24 outputs an amplified transmission signal to the filter 22.

The low-noise amplifier 25 amplifies a signal (reception signal) received by the antenna 4. An input terminal of the low-noise amplifier 25 is electrically connected to the filter 23. An output terminal of the low-noise amplifier 25 is electrically connected to the signal processing circuit 3. The low-noise amplifier 25 amplifies a signal (reception signal) passed through the first filter 11 and the filter 23. The low-noise amplifier 25 outputs an amplified reception signal to the signal processing circuit 3.

The second processing unit 30 includes a second switch 31, filters 32, 33, 34, a third switch 35, a fourth switch 36, a power amplifier 37, and a low-noise amplifier 38.

As illustrated in FIG. 1, the second switch 31 includes a common terminal 311, and a plurality of (three in the illustrated example) selection terminals 312, 313, and 314. The common terminal 311 is electrically connected to the second filter 12. The selection terminal 312 is electrically connected to the filter 32. The selection terminal 313 is electrically connected to the filter 33. The selection terminal 314 is electrically connected to the filter 34.

The second switch 31 is capable of selecting at least one selection terminal of the selection terminals 312, 313, and 314 as a connection destination of the common terminal 311. That is, the second switch 31 is capable of selectively connecting the filter 32, the filter 33, or the filter 34, to the second filter 12.

The second switch 31 is controlled by, for example, the signal processing circuit 3. The second switch 31, in accordance with a control signal from the RF signal processing circuit 5 of the signal processing circuit 3, electrically connects one selection terminal of the selection terminal 312, the selection terminal 313, and the selection terminal 314 to the common terminal 311.

Each of the filters 32, 33, and 34 is, for example, an acoustic wave filter, and each of a plurality of series arm resonators and a plurality of parallel arm resonators is defined by an acoustic wave resonator, for example. The acoustic wave filter is, for example, a SAW filter that utilizes a surface acoustic wave. Note that, the filters 32, 33, and 34 are not limited to the SAW filters. The filters 32, 33, and 34 may be, for example, BAW filters rather than the SAW filters. Alternatively, the filters 32, 33 and 34 may each include an FBAR or the like, for example. Further, the filters 32, 33, and 34 may each be defined by an LC resonance circuit or the like, for example.

Each of the filters 32 to 34 is a duplexer. The filters 32 to 34 are electrically connected to the plurality of selection terminals 312 to 314 of the second switch 31, respectively in a one-to-one manner. The filters 32 to 34 are electrically connected to a plurality of (three in the illustrated example) selection terminals 352 to 354 of the third switch 35, respectively in a one-to-one manner. The filters 32 to 34 are electrically connected to the plurality of (three in the illustrated example) selection terminals 362 to 364 of the fourth switch 36, respectively in a one-to-one manner.

The filter 32 allows a signal (transmission signal) in Band 1 transmitted from the antenna 4, and a signal (reception signal) in Band 1 received by the antenna 4 to pass therethrough. The filter 33 allows a signal (transmission signal) in Band 7 transmitted from the antenna 4, and a signal (reception signal) in Band 7 received by the antenna 4 to pass therethrough. The filter 34 allows a signal (transmission signal) in Band 8 transmitted from the antenna 4, and a signal (reception signal) in Band 8 received by the antenna 4 to pass therethrough.

As illustrated in FIG. 1, the third switch 35 includes a common terminal 351, and a plurality of (three in the illustrated example) selection terminals 352, 353, and 354. The common terminal 351 is electrically connected to the power amplifier 37. The selection terminal 352 is electrically connected to the filter 32. The selection terminal 353 is electrically connected to the filter 33. The selection terminal 354 is electrically connected to the filter 34.

The third switch 35 is capable of selecting one selection terminal of the selection terminals 352, 353, and 354 as a connection destination of the common terminal 351. That is, the third switch 35 is capable of selectively connecting the filter 32, the filter 33, or the filter 34, to the power amplifier 37.

The third switch 35 is controlled by, for example, the signal processing circuit 3. The third switch 35, in accordance with a control signal from the RF signal processing circuit 5 of the signal processing circuit 3, electrically connects one selection terminal of the selection terminal 352, the selection terminal 353, and the selection terminal 354 to the common terminal 351.

As illustrated in FIG. 1, the fourth switch 36 includes a common terminal 361, and a plurality of (three in the illustrated example) selection terminals 362, 363, and 364. The common terminal 361 is electrically connected to the low-noise amplifier 38. The selection terminal 362 is electrically connected to the filter 32. The selection terminal 363 is electrically connected to the filter 33. The selection terminal 364 is electrically connected to the filter 34.

The fourth switch 36 is capable of selecting one selection terminal of the selection terminals 362, 363, and 364 as a connection destination of the common terminal 361. That is, the fourth switch 36 is capable of selectively connecting the filter 32, the filter 33, or the filter 34, to the low-noise amplifier 38.

The fourth switch 36 is controlled by, for example, the signal processing circuit 3. The fourth switch 36, in accordance with a control signal from the RF signal processing circuit 5 of the signal processing circuit 3, electrically connects one selection terminal of the selection terminal 362, the selection terminal 363, and the selection terminal 364 to the common terminal 361.

The power amplifier 37 amplifies a signal (transmission signal) transmitted from the antenna 4. An input terminal of the power amplifier 37 is electrically connected to the signal processing circuit 3. An output terminal of the power amplifier 37 is electrically connected to the common terminal 351 of the third switch 35. The power amplifier 37 amplifies a signal outputted from the signal processing circuit 3. The power amplifier 37 outputs an amplified transmission signal to one filter of the filters 32 to 34, that is electrically connected to the power amplifier 37 with the third switch 35 interposed therebetween.

The low-noise amplifier 38 amplifies a signal (reception signal) received by the antenna 4. An input terminal of the low-noise amplifier 38 is electrically connected to the common terminal 361 of the fourth switch 36. An output terminal of the low-noise amplifier 38 is electrically connected to the signal processing circuit 3. The low-noise amplifier 38 amplifies a signal (reception signal) passed through the second filter 12 and a filter of the filters 32 to 34, that is electrically connected to the low-noise amplifier 38. The low-noise amplifier 38 outputs an amplified reception signal to the signal processing circuit 3.

The third processing unit 40 includes filters 41, 44 to 47, a fifth switch 42, a sixth switch 43, power amplifiers 48, 50, and low-noise amplifiers 49 and 51.

Each of the filters 41 and 44 to 47 is, for example, an acoustic wave filter, and each of a plurality of series arm resonators and a plurality of parallel arm resonators is defined by an acoustic wave resonator. The acoustic wave filter is, for example, a SAW filter that utilizes a surface acoustic wave. Note that, a plurality of filters 41 and 44 to 47 is not limited to the SAW filters. The plurality of filters may be, for example, BAW filters rather than the SAW filters. Alternatively, the plurality of filters 41, 44 to 47 may include an FBAR or the like, for example. In addition, the filters 41 and 44 to 47 may each be defined by an LC resonance circuit or the like, for example.

The filter 41 is a duplexer. The filter 41 is electrically connected to the third filter 13. The filter 41 is electrically connected to a common terminal 421 of the fifth switch 42. The filter 41 is electrically connected to a common terminal 431 of the sixth switch 43.

The filter 41 outputs a signal in Band 42 passed through the third filter 13 to the common terminal 421 of the fifth switch 42. The filter 41 outputs a signal in Band 42 received from the fifth switch 42 to the third filter 13. The filter 41 outputs a signal in Band 52 passed through the third filter 13 to the common terminal 431 of the sixth switch 43. The filter 41 outputs a signal in Band 52 received from the sixth switch 43 to the third filter 13.

As illustrated in FIG. 1, the fifth switch 42 includes the common terminal 421, and a plurality of (two in the illustrated example) selection terminals 422 and 423. The common terminal 421 is electrically connected to the filter 41. The selection terminal 422 is electrically connected to the filter 44. The selection terminal 423 is electrically connected to the filter 45.

The fifth switch 42 is capable of selecting one selection terminal of the selection terminals 422 and 423 as a connection destination of the common terminal 421. That is, the fifth switch 42 is capable of selectively connecting the filter 44 or the filter 45, to the filter 41.

The fifth switch 42 is controlled by, for example, the signal processing circuit 3. The fifth switch 42, in accordance with a control signal from the RF signal processing circuit 5 of the signal processing circuit 3, electrically connects one selection terminal of the selection terminal 422 and the selection terminal 423 to the common terminal 421.

As illustrated in FIG. 1, the sixth switch 43 includes the common terminal 431, and a plurality of (two in the illustrated example) selection terminals 432 and 433. The common terminal 431 is electrically connected to the filter 41. The selection terminal 432 is electrically connected to the filter 46. The selection terminal 433 is electrically connected to the filter 47.

The sixth switch 43 is capable of selecting one selection terminal of the selection terminals 432 and 433 as a connection destination of the common terminal 431. That is, the sixth switch 43 is capable of selectively connecting the filter 46 or the filter 47, to the filter 41.

The sixth switch 43 is controlled by, for example, the signal processing circuit 3. The sixth switch 43, in accordance with a control signal from the RF signal processing circuit 5 of the signal processing circuit 3, electrically connects one selection terminal of the selection terminal 432 and the selection terminal 433 to the common terminal 431.

The filter 44 allows a signal (transmission signal) in Band 42 transmitted from the antenna 4 to pass therethrough. For example, the filter 44 outputs a signal in Band 42 outputted from the signal processing circuit 3 to the filter 41 with the common terminal 421 of the fifth switch 42 interposed therebetween.

The filter 45 allows a signal (reception signal) in Band 42 received by the antenna 4 to pass therethrough. For example, the filter 45 outputs a signal in Band 42 passed through the third filter 13 to the low-noise amplifier 49.

The filter 46 allows a signal (transmission signal) in Band 52 transmitted from the antenna 4 to pass therethrough. For example, the filter 46 outputs a signal in Band 52 outputted from the signal processing circuit 3 to the filter 41 with the common terminal 431 of the sixth switch 43 interposed therebetween.

The filter 47 allows a signal (reception signal) in Band 52 received by the antenna 4 to pass therethrough. For example, the filter 47 outputs a signal in Band 52 passed through the third filter 13 to the low-noise amplifier 51.

The power amplifier 48 amplifies a signal (transmission signal) in Band 42 transmitted from the antenna 4. An input terminal of the power amplifier 48 is electrically connected to the signal processing circuit 3. An output terminal of the power amplifier 48 is electrically connected to the filter 44. The power amplifier 48 amplifies a signal outputted from the signal processing circuit 3. The power amplifier 48 outputs an amplified transmission signal to the filter 44.

The low-noise amplifier 49 amplifies a signal (reception signal) in Band 42 received by the antenna 4. An input terminal of the low-noise amplifier 49 is electrically connected to the filter 45. An output terminal of the low-noise amplifier 49 is electrically connected to the signal processing circuit 3. The low-noise amplifier 49 amplifies a signal (reception signal) in Band 42 passed through the filter 45. The low-noise amplifier 49 outputs an amplified reception signal to the signal processing circuit 3.

The power amplifier 50 amplifies a signal (transmission signal) in Band 52 transmitted from the antenna 4. An input terminal of the power amplifier 50 is electrically connected to the signal processing circuit 3. An output terminal of the power amplifier 50 is electrically connected to the filter 46. The power amplifier 50 amplifies a signal outputted from the signal processing circuit 3. The power amplifier 50 outputs an amplified transmission signal to the filter 46.

The low-noise amplifier 51 amplifies a signal (reception signal) in Band 52 received by the antenna 4. An input terminal of the low-noise amplifier 51 is electrically connected to the filter 47. An output terminal of the low-noise amplifier 51 is electrically connected to the signal processing circuit 3. The low-noise amplifier 51 amplifies a signal (reception signal) in Band 52 passed through the filter 47. The low-noise amplifier 51 outputs an amplified reception signal to the signal processing circuit 3.

In the present preferred embodiment, a common inductor L1 electrically connected to the first filter 11 is provided. Inductance of the common inductor L1 is preferably, for example, about 0.01 nH.

Note that, the high-frequency module 1 may include a first matching circuit electrically connected between the first filter 11 and an input/output terminal 712 (see FIG. 3), which will be described later. The first matching circuit is a circuit to match impedance between a circuit connected to a side opposite to a side of the first filter 11 at the input/output terminal 712, and the first filter 11, for example.

Similarly, the high-frequency module 1 may include a matching circuit electrically connected between the second filter 12 and an external connection terminal 711. The high-frequency module 1 may include a matching circuit electrically connected between the third filter 13 and the external connection terminal 711.

Here, a circuit configuration of the first filter 11 will be described.

Figure 2:
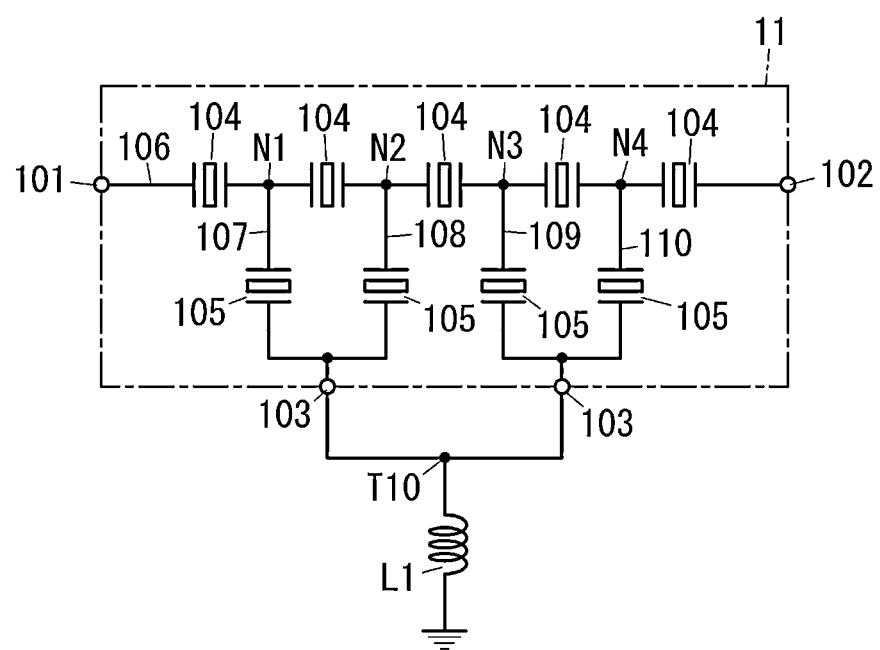
FIG. 2 is a circuit diagram of a first filter included in the high-frequency module of FIG. 1.

As illustrated in FIG. 2, the first filter 11 includes a first input/output terminal 101, a second input/output terminal 102, a plurality of (two in the illustrated example) ground terminals 103, a plurality of (five in the illustrated example) series arm resonators 104, and a plurality of (four in the illustrated example) parallel arm resonators 105. That is, the first filter 11 is a ladder filter.

The plurality of series arm resonators 104 are provided on a first path 106 connecting the first input/output terminal 101 to the second input/output terminal 102. The plurality of parallel arm resonators 105 are provided on a plurality of (four in the illustrated example) second paths 107, 108, 109, and 110 that connects a plurality of (four) nodes N1, N2, N3, and N4 on the first path 106 to the ground terminals 103, such that one parallel arm resonator is provided on one second path.

A first end of each of the second paths 107 to 110 is connected to the first path 106. Second ends of the respective second paths 107 and 108 are bundled as one, and connected to one ground terminal 103 of the two ground terminals 103. Second ends of the respective second paths 109 and 110 are bundled as one, and connected to another ground terminal 103 of the two ground terminals 103. A plurality of the ground terminals 103 are connected to the one common inductor L1. That is, the second ends of the respective second paths 107 to 110 are bundled as one and connected to the common inductor L1.

A first end of the common inductor L1 is connected to all of the plurality of ground terminals 103 at a connection point T10. That is, the first end of the common inductor L1 is connected to all of the plurality of parallel arm resonators 105. A second end of the common inductor is connected to a ground terminal 713 included in the high-frequency module 1 and provides grounding. That is, the second end of the common inductor is grounded. Here, the first end of the common inductor L1 corresponds to the connection point T10.

That is, each of a plurality of (four) parallel arm resonators 105 is grounded with the common inductor L1 that is a common inductor element interposed therebetween.

Next, structure of the high-frequency module 1 will be described.

As illustrated in FIG. 3, the mounting substrate 60 includes a first main surface 61 and a second main surface 62 facing each other in a thickness direction D1. The filter device 10a including the first filter 11 and the third filter 13 are disposed on the first main surface 61 (see FIG. 3). Note that, the first processing unit 20, the second processing unit 30, and the third processing unit 40 may be disposed on the mounting substrate 60, or may be disposed on another mounting substrate. In the present preferred embodiment, the first processing unit 20, the second processing unit 30, and the third processing unit 40 are disposed on another mounting substrate.

The high-frequency module 1 further includes a plurality of (six in the illustrated example) electronic components 16. The plurality of electronic components 16 are disposed on the first main surface 61 of the mounting substrate 60. The plurality of electronic components 16 include electronic components of the high-frequency module 1.

The mounting substrate 60 is preferably, for example, a printed wiring board, a low temperature co-fired ceramics (LTCC), high temperature co-fired ceramics (HTCC), or resin substrate. Here, the mounting substrate 60 is preferably, for example, a multi-layer substrate including a plurality of dielectric layers and a plurality of conductive layers. The plurality of dielectric layers and the plurality of conductive layers are stacked in the thickness direction D1 of the mounting substrate 60. Each of the plurality of conductive layers has a predetermined pattern defined for each layer. Each of the plurality of conductive layers includes one or a plurality of conductive portions in one plane orthogonal or substantially orthogonal to the thickness direction D1 of the mounting substrate 60. A material of each conductive layer is preferably, for example, copper. The plurality of conductive layers includes a ground layer. In the high-frequency module 1, a plurality of ground terminals and the ground layer are electrically connected to each other with a via conductor 600 and the like included in the mounting substrate 60 interposed therebetween.

The mounting substrate 60 is not limited to a printed wiring board or an LTCC substrate, and may be a wiring structure, for example. The wiring structure is preferably, for example, a multilayer structure. The multilayer structure includes at least one insulating layer and at least one conductive layer. The insulating layer is has a predetermined pattern. When a plurality of the insulating layers are provided, each of the plurality of insulating layers has a predetermined pattern defined for each layer. The conductive layer has a predetermined pattern that is different from the predetermined pattern of the insulating layer. When a plurality of the conductive layers are provided, each of the plurality of conductive layers has a predetermined pattern defined for each layer. The conductive layer may include one or a plurality of redistribution portions. In the wiring structure, a first surface of two surfaces facing each other in a thickness direction of the multilayer structure is the first main surface 61 of the mounting substrate 60, and a second surface is the second main surface 62 of the mounting substrate 60. The wiring structure may preferably be, for example, an interposer. The interposer may include a silicon substrate, or may include multiple layers, for example.

The mounting substrate 60 has, for example, a polygonal or substantially polygonal shape in plan view from the thickness direction D1. For example, the mounting substrate 60 has a quadrangular or substantially quadrangular shape in plan view from the thickness direction D1. The mounting substrate 60 includes a plurality of the external connection terminals 711. The mounting substrate 60 is connected to a mother substrate by the plurality of external connection terminals 711. The plurality of external connection terminals 711 include the antenna terminal T1, the input/output terminal 712, and the ground terminal 713. The antenna terminal T1 is connected to the first input/output terminal 101 of the first filter 11. The input/output terminal 712 of the mounting substrate 60 is connected to the second input/output terminal 102 of the first filter 11. The ground terminal 713 of the mounting substrate 60 is connected to a plurality of the ground terminals 103 of the first filter 11.

The mounting substrate 60 includes a first land electrode 671, a second land electrode 672, and a plurality of third land electrodes 673. A shape of each of the first land electrode 671, the second land electrode 672, and the plurality of third land electrodes 673 is, for example, a circular or substantially circular shape in plan view from the thickness direction D1 of the mounting substrate 60.

The first land electrode 671 is connected to the antenna terminal T1 (external connection terminal 711). The first land electrode 671 is connected to the first input/output terminal 101. Thus, the first input/output terminal 101 is connected to the antenna terminal T1 with the first land electrode 671 interposed therebetween.

The second land electrode 672 is connected to the second input/output terminal 102. The plurality of third land electrodes 673 are respectively connected to the plurality of ground terminals 103. One land electrode of the first land electrode 671 and the second land electrode 672 is disposed at a corner portion 60a of the first main surface 61 of the mounting substrate 60 in plan view from the thickness direction D1. Here, the second land electrode 672 is disposed at the corner portion 60a. Note that, the first land electrode 671 may be disposed at the corner portion 60a.

As illustrated in FIG. 3, the mounting substrate 60 includes a plurality of the via conductors 600. The plurality of via conductors 600 include a via conductor 601, and a plurality of (two in the illustrated example) via conductors 610. The mounting substrate 60 includes via conductors 650 and 651. The mounting substrate 60 includes a wiring portion in one conductive layer (first conductive layer) of the plurality of conductive layers. That is, the mounting substrate 60 includes a first wiring portion 630 between the first main surface 61 and the second main surface 62. The mounting substrate 60 includes a second wiring portion 655 in a second conductive layer that is different from the first conductive layer. That is, the mounting substrate 60 includes the first wiring portion 630 between the first main surface 61 and the second main surface 62. Here, the second conductive layer is disposed between the first conductive layer and the second main surface 62. Thus, the first wiring portion 630 and the second wiring portion 655 are included in respective conductive layers different from each other. More specifically, the second wiring portion 655 is disposed on a side of the second main surface 62 rather than the first wiring portion 630 in the thickness direction D1.

One end of the via conductor 601 is connected to the second land electrode 672. Another end of the via conductor 601 is connected to the input/output terminal 712 (external connection terminal 711). That is, the via conductor 601 connects the second input/output terminal 102 of the first filter 11 to the input/output terminal 712 of the mounting substrate 60 with the second land electrode 672 interposed therebetween.

The plurality of via conductors 610 are connected to the plurality of third land electrodes 673 in a one-to-one manner. That is, the plurality of via conductors 610 are respectively connected to the plurality of ground terminals 103 of the first filter 11. The plurality of via conductors 610 are connected to the first wiring portion 630. That is, the first wiring portion 630 is connected to the plurality of ground terminals 103 with the respective plurality of via conductors 610 interposed therebetween.

A first end of the via conductor 650 is connected to all of the plurality of ground terminals 103. Specifically, the first end of the via conductor 650 is connected to the first wiring portion 630. A second end of the via conductor 650 is connected to the ground terminal 713. Specifically, the second end of the via conductor 650 is connected to the second wiring portion 655.

A first end of the via conductor 651 is connected to the second wiring portion 655. A second end of the via conductor 651 is connected to the ground terminal 713 of the mounting substrate 60. Specifically, the second end of the via conductor 651 is connected to the ground terminal 713 with a ground layer 660 as a conductive layer interposed therebetween. Here, the ground layer 660 is a conductive layer closest to the second main surface 62 of the plurality of conductive layers.

As described above, the first end of the common inductor L1 is connected to all of the plurality of parallel arm resonators 105, and the second end of the common inductor is connected to the ground terminal 713. Further, the first end of the via conductor 650 is connected to all of the plurality of ground terminals 103, and the second end of the via conductor 650 is connected to the ground terminal 713 with the second wiring portion 655 and the via conductor 651 interposed therebetween. That is, the common inductor L1 includes at least the via conductor 650. In the present preferred embodiment, the common inductor L1 includes the via conductors 650, 651, and the second wiring portion 655.

3. COMMUNICATION DEVICE

As illustrated in FIG. 1, the communication device 500 according to the present preferred embodiment includes the high-frequency module 1, the antenna 4, and the signal processing circuit 3. The communication device 500 transmits and receives signals with the antenna 4 interposed therebetween.

The signal processing circuit 3 processes a signal passing through the high-frequency module 1. The signal processing circuit 3 includes, for example, the RF signal processing circuit 5, and a baseband signal processing circuit 6.

As illustrated in FIG. 1, the baseband signal processing circuit 6 is preferably, for example, a baseband integrated circuit (BBIC), and is electrically connected to the RF signal processing circuit 5. The baseband signal processing circuit 6 generates an I-phase signal and a Q-phase signal from a baseband signal. The baseband signal processing circuit 6 performs IQ modulation processing by combining the I-phase signal and the Q-phase signal, and outputs a transmission signal. At this time, the transmission signal is generated as a modulated signal obtained by performing amplitude modulation for a carrier signal having a predetermined frequency at a cycle longer than a cycle of the carrier signal.

As illustrated in FIG. 1, the RF signal processing circuit 5 is preferably, for example, a radio frequency integrated circuit (RFIC), and is provided between the high-frequency module 1 and the baseband signal processing circuit 6. The RF signal processing circuit 5 performs signal processing on a transmission signal from the baseband signal processing circuit 6, and a function of performing signal processing on a reception signal received by the antenna 4. The RF signal processing circuit 5 is a multi-band supporting processing circuit, and is capable of generating and amplifying transmission signals in a plurality of communication bands.

Note that, in the communication device 500, the baseband signal processing circuit 6 is not required.

4. ADVANTAGES

As described above, the high-frequency module 1 of the present preferred embodiment includes the mounting substrate 60, the filter (the first filter 11), and the common inductor L1. The mounting substrate 60 includes the first main surface 61 and the second main surface 62 facing each other. The filter includes the plurality of series arm resonators 104 and the plurality of parallel arm resonators 105, and is disposed on the first main surface 61. The mounting substrate 60 includes the ground terminal 713 on the second main surface 62. The first end of the common inductor L1 is connected to all of the plurality of parallel arm resonators 105. The second end of the common inductor L1 is connected to the ground terminal 713.

Further, the high-frequency module 1 includes the mounting substrate 60 and the filter (the first filter 11). The mounting substrate 60 includes the first main surface 61 and the second main surface 62 facing each other. The filter includes the first input/output terminal 101, the second input/output terminal 102, and the plurality of ground terminals 103, and is disposed on the first main surface 61 of the mounting substrate 60. The mounting substrate 60 includes the ground terminal 713, on the second main surface 62, and has the via conductor 650 between the first main surface 61 and the second main surface 62. The first end of the via conductor 650 is connected to all of the plurality of ground terminals 103. The second end of the via conductor 650 is connected to the ground terminal 713.

An inductance component of the via conductor 650 contributes to an inductance component of the common inductor L1. Thus, the via conductor 650 is included in the common inductor L1 as a part of the common inductor L1.

Figure 4:
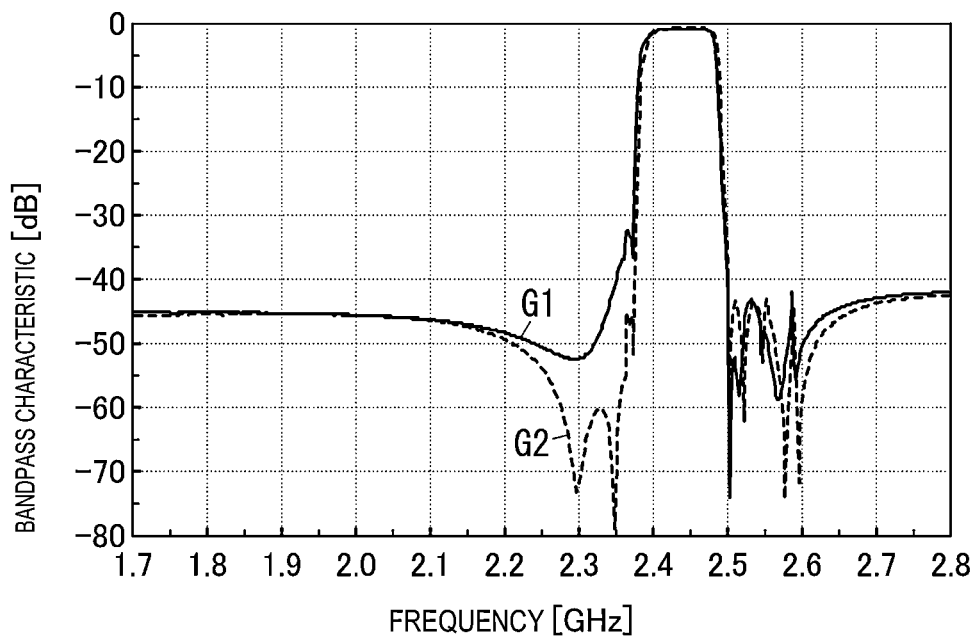
FIG. 4 is a diagram illustrating filter bandpass characteristics of each of a first filter that is not connected to a common inductor according to Preferred Embodiment 1 of the present invention and an equivalent circuit of the first filter.

FIG. 4 illustrates filter bandpass characteristics (frequency characteristics) of an equivalent circuit of the first filter 11 that is not connected to the common inductor L1, and filter bandpass characteristics (frequency characteristics) of the first filter 11 that is not connected to the common inductor L1. A graph G1 in FIG. 4 illustrates the frequency characteristics of the equivalent circuit of the first filter 11 that is not connected to the common inductor L1. A graph G2 in FIG. 4 illustrates the frequency characteristics of the first filter 11 that is not connected to the common inductor L1. A vertical axis of the graph in FIG. 4 illustrates bandpass characteristic [dB], and a horizontal axis illustrates frequency [GHz].

According to the graph G2, the equivalent circuit allows a signal in the 2.4 GHz band (about 2.400 GHz to about 2.483 GHz) for the Wi-Fi communication to pass therethrough, and an unnecessary signal in a frequency band near a low frequency side of the 2.4 GHz band (for example, about 2.3 GHz to about 2.38 GHz) to attenuate.

On the other hand, according to the graph G1, the first filter 11 that is not connected to the common inductor L1 allows a signal in the 2.4 GHz band (about 2.400 GHz to about 2.483 GHz) for the Wi-Fi communication to pass therethrough. However, in a frequency band in which an unnecessary signal is to be attenuated as in the equivalent circuit, for example, in a frequency band near the low frequency side of the 2.4 GHz band (for example, about 2.3 GHz to about 2.38 GHz), an unnecessary signal does not attenuate. Accordingly, there is a possibility that the quality of communication in the 2.4 GHz band for the Wi-Fi communication is deteriorated.

Figure 5:
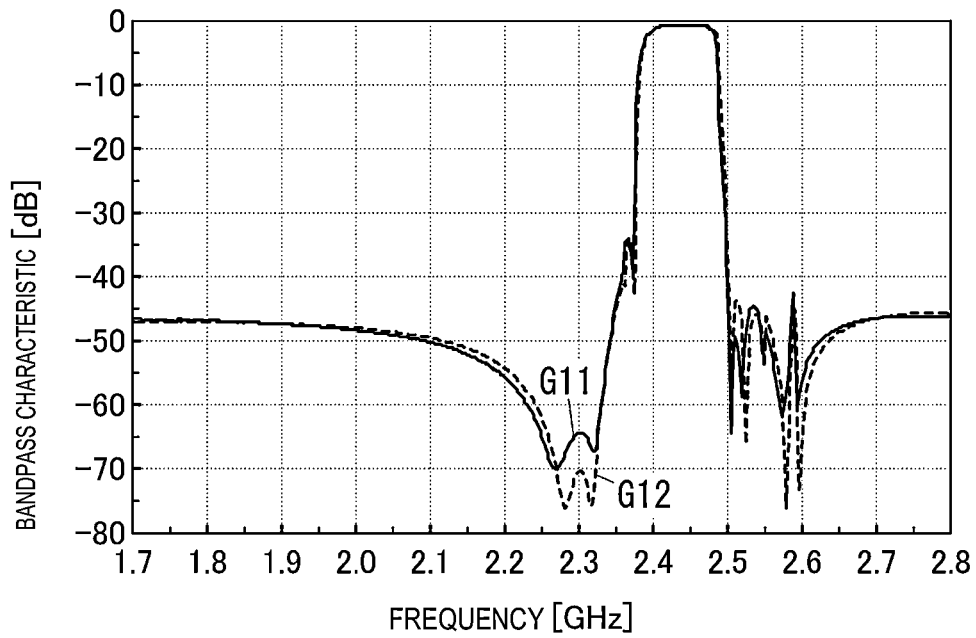
FIG. 5 is a diagram illustrating filter bandpass characteristics of each of the first filter that is connected to the common inductor and the equivalent circuit of the first filter.

FIG. 5 illustrates filter bandpass characteristics (frequency characteristics) of an equivalent circuit including the common inductor L1 and the first filter 11, and filter bandpass characteristics (frequency characteristics) of the first filter 11 that is connected to the common inductor L1. A graph G11 in FIG. 5 illustrates frequency characteristics of the first filter 11 connected to the common inductor L1. A graph G12 in FIG. 5 illustrates frequency characteristics of the equivalent circuit of the first filter 11 connected to the common inductor L1. A vertical axis of the graph in FIG. 5 illustrates bandpass characteristic [dB], and a horizontal axis illustrates frequency [GHz]. Note that, the frequency characteristics illustrated in FIG. 5 are characteristics in a configuration including the first filter 11 and the common inductor L1.

According to the graph G12, as in the equivalent circuit of the first filter 11 to which the common inductor L1 is not connected, the equivalent circuit allows a signal in the 2.4 GHz band (about 2.400 GHz to about 2.483 GHz) for the Wi-Fi communication to pass therethrough, and an unnecessary signal in a frequency band near the low frequency side of the 2.4 GHz band (for example, about 2.3 GHz to about 2.38 GHz) to attenuate.

According to the graph G11, the first filter 11 that is connected to the common inductor L1 allows a signal in the 2.4 GHz band (about 2.400 GHz to about 2.483 GHz) for the Wi-Fi communication to pass therethrough. Further, in a frequency band in which an unnecessary signal is to be attenuated as in an equivalent circuit, for example, in a frequency band near the low frequency side of the 2.4 GHz band (for example, about 2.3 GHz to about 2.38 GHz), an unnecessary signal is caused to attenuate. Thus, it is possible to suppress deterioration in quality of communication in the 2.4 GHz band for the Wi-Fi communication. That is, it is possible to improve filter characteristics.

5. MODIFIED EXAMPLES

Hereinafter, modified examples of Preferred Embodiment 1 of the present invention will be described. Note that, modified examples described below can be appropriately applied in combination with the above-described preferred embodiment.

5.1. Modified Example 1

In the above-described preferred embodiment, the configuration is provided in which the pairs in the plurality of parallel arm resonators 105 are bundled and respectively connected to the ground terminals 103 that are different from each other, but the present invention is not limited to this configuration.

The plurality of parallel arm resonators 105 may be respectively connected to the ground terminals 103 that are different from each other. In this case, the first filter 11 includes the same number of ground terminals 103 as the number of parallel arm resonators 105.

Figure 6:
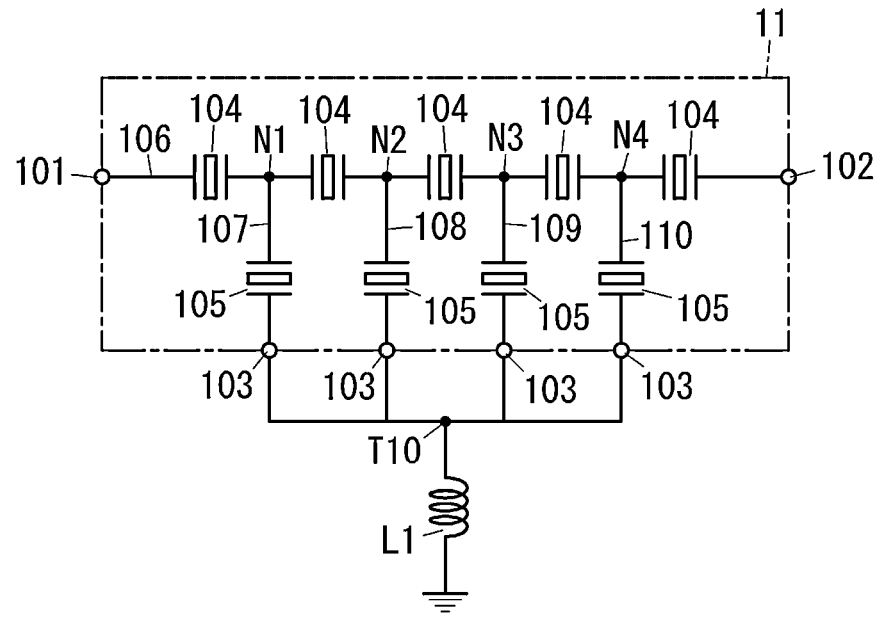
FIG. 6 is a circuit diagram of a first filter according to Modified Example 1 of Preferred Embodiment 1 of the present invention.

For example, as illustrated in FIG. 6, the plurality of (for example, four) parallel arm resonators 105 provided on the second paths 107, 108, 109, and 110 in a one-to-one manner may be connected to the plurality of ground terminals 103 in a one-to-one manner. In this case, all of the plurality of ground terminals 103 are connected to a first end of the common inductor L1 at the connection point T10. That is, the plurality of ground terminals 103 are bundled as one and connected to the common inductor L1.

Note that, one of a set of the second paths 107 and 108 and a set of the second paths 109 and 110 may be bundled as one in the same or substantially the same manner as in the above-described preferred embodiment, and may be connected to the one ground terminal 103.

5.2. Modified Example 2

The first filter 11 may include an inductor connected in series to the parallel arm resonator 105 in each of the second paths 107 to 110.

Figure 7:
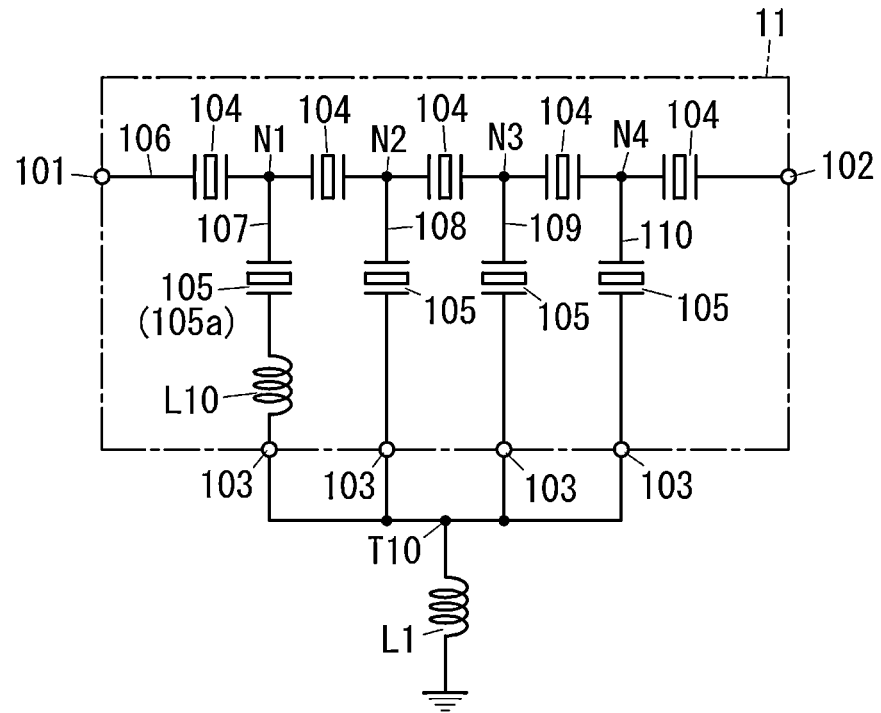
FIG. 7 is a circuit diagram of a first filter according to Modified Example 2 of Preferred Embodiment 1 of the present invention.

For example, the first filter 11 may further include an inductor L10 that is connected in series to one parallel arm resonator 105a of the plurality of parallel arm resonators 105 (see FIG. 7).

In this case, the inductor L10 is disposed on a path (the second path 107) between an end portion of the parallel arm resonator 105a that is an end portion (a connection point to the node N1) connected on a path (the first path 106) to which a plurality of series arm resonators are connected, and a first end (for example, the connection point T10) of the common inductor L1. In the present modified example, the inductor L10 is disposed between the parallel arm resonator 105a and the ground terminal 103.

Note that, at least one of a set of the second paths 107 and 108 and a set of the second paths 109 and 110 may be bundled as one in the same or substantially the same manner as in the preferred embodiment, and may be connected to the one ground terminal 103.

5.3. Modified Example 3

The first filter 11 may further include an inductor L11 connected in series to the two or more parallel arm resonators 105 of the parallel arm resonators 105 remaining after excluding the one parallel arm resonator 105 from a plurality of the parallel arm resonators 105.

Figure 8:
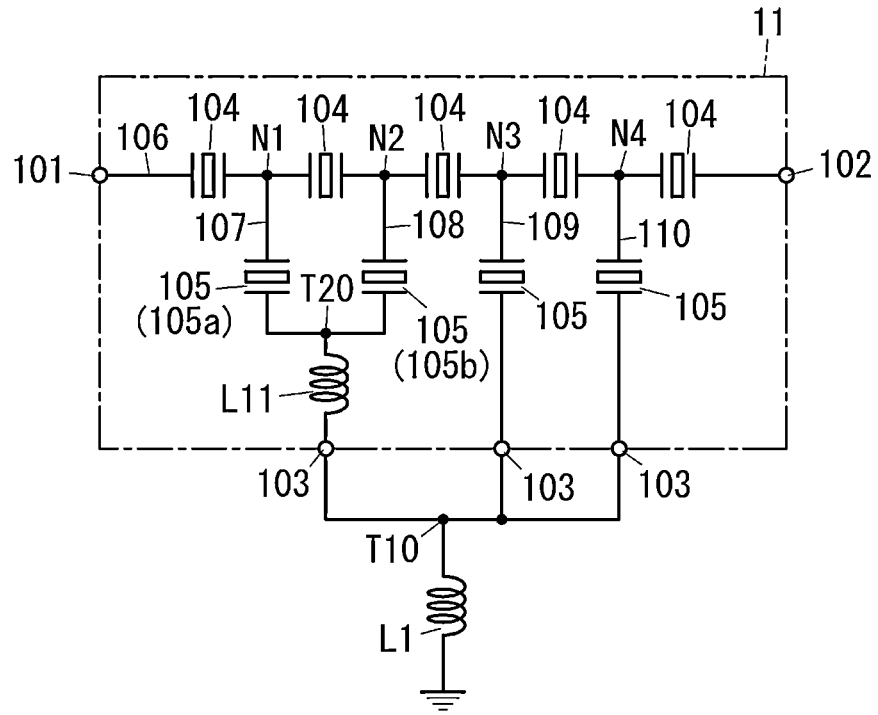
FIG. 8 is a circuit diagram of a first filter according to Modified Example 3 of Preferred Embodiment 1 of the present invention.

For example, the first filter 11 may include the inductor L11 connected in series to the two or more (two, here) parallel arm resonators 105 (105a and 105b) of the parallel arm resonators 105 remaining after excluding the one parallel arm resonator 105 from a plurality of the parallel arm resonators 105 (see FIG. 8).

In this case, the inductor L11 is disposed on paths (the second paths 107 and 108) between end portions of the respective two or more parallel arm resonators 105a and 105b that are end portions (here, connection points to the respective nodes N1 and N2) respectively connected on a path (the first path 106) to which a plurality of the series arm resonators 104 is connected, and a first end of the common inductor L1. In the present modified example, the inductor L11 is disposed between a connection point T20 between the second path 107 and the second path 108 and the ground terminal 103.

Note that, at least the two second paths (here, the second paths 109 and 110) of a plurality of the second paths that are not connected to the inductor L11 may be bundled as one, and connected to the one ground terminal 103.

5.4. Modified Example 4

Modified Example 1 and Modified Example 2 may be combined with each other.

Figure 9:
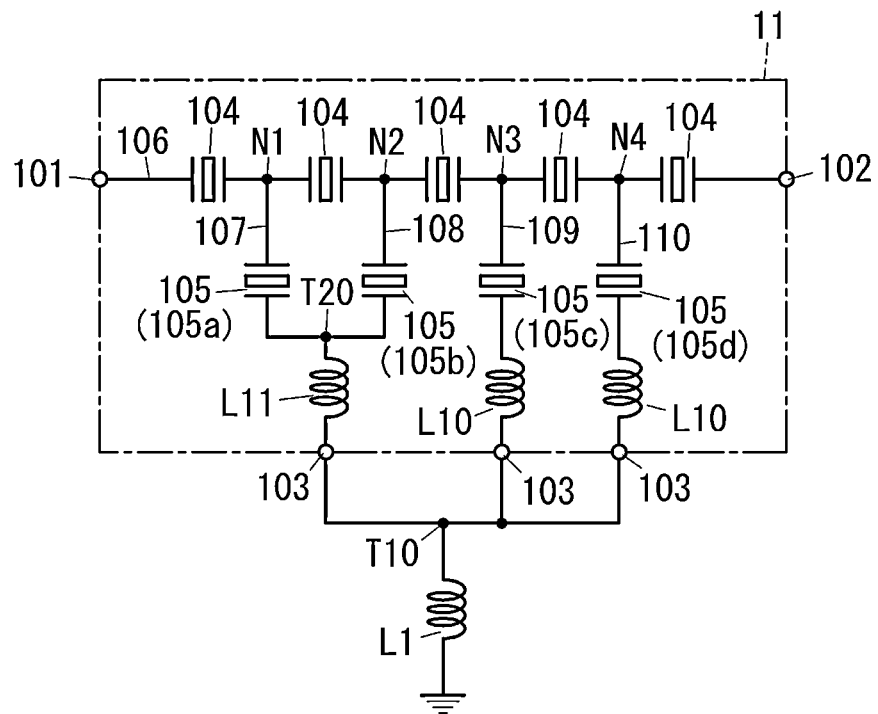
FIG. 9 is a circuit diagram of a first filter according to Modified Example 4 of Preferred Embodiment 1 of the present invention.

For example, the first filter 11 may further include the inductor L11 connected to the two parallel arm resonators 105a and 105b, and the two inductors L10 connected in series to parallel arm resonators 105c and 105d, respectively (see FIG. 9).

Note that, at least two second paths of a plurality of the second paths (here, the second paths 109 and 110) connected to the inductor L10 may be bundled as one, and connected to the one ground terminal 103.

5.5. Modified Example 5

In the above-described preferred embodiment, the configuration in which the filter 10 includes three filters (the first filter 11, the second filter 12, and the third filter 13) is provided, but the present invention is not limited to this configuration.

The filter 10 may be configured to include, for example, two filters (the first filter 11 and the second filter 12).

5.6. Modified Example 6

In the above-described preferred embodiment, the configuration is provided in which the third filter 13 is the ultra-high band filter, but the present invention is not limited to this configuration. The third filter 13 may be a filter having a pass band on a lower frequency side than both of a predetermined pass band of the first filter 11 and a pass band of the second filter 12. That is, the third filter 13 has a pass band on a higher frequency side or a lower frequency side than both of a predetermined pass band of the first filter 11 and a pass band of the second filter 12.

Alternatively, for example, a pass band of the third filter 13 may correspond to a frequency band in a 5 GHz band for Wi-Fi communication.

5.7. Modified Example 7

In the above-described preferred embodiment, the high-frequency module 1 is configured to include the antenna terminal T1, the filter 10, the first processing unit 20, the second processing unit 30, the third processing unit 40, and the mounting substrate 60, but the present invention is not limited to this configuration.

The high-frequency module 1 may be configured to include the filter 10 and the mounting substrate 60. Alternatively, the high-frequency module 1 may be configured to include the filter device 10a including the first filter 11 and the second filter 12, and the mounting substrate 60. Alternatively, the high-frequency module 1 may be configured to include the first filter 11 of the filter 10, and the mounting substrate 60 on which the first filter 11 is disposed. That is, it is sufficient that the high-frequency module 1 is configured to include at least the first filter 11 and the mounting substrate 60.

Preferred Embodiment 2

Preferred Embodiment 2 of the present invention differs from Preferred Embodiment 1 in that, in plan view from the thickness direction D1 of a mounting substrate 60A, a plurality of via conductors are provided between the first input/output terminal 101 and the second input/output terminal 102 of the first filter 11.

Hereinafter, a high-frequency module 1A of Preferred Embodiment 2 will be described with reference to FIG. 10 to FIG. 19. Note that, description of components the same as or similar to those in Preferred Embodiment 1 will be omitted as appropriate.

Hereinafter, the high-frequency module 1A according to Preferred Embodiment 2 will be described. Note that, the communication device 500 of Preferred Embodiment 2 is obtained by including the high-frequency module 1A according to Preferred Embodiment 2 and the signal processing circuit 3 described in Preferred Embodiment 1.

The high-frequency module 1A according to Preferred Embodiment 2 includes the mounting substrate 60A and the first filter 11. The mounting substrate 60A includes the first main surface 61 and the second main surface 62 facing each other. The first filter 11 includes the first input/output terminal 101 and the second input/output terminal 102, and is disposed on the first main surface 61 of the mounting substrate 60A. The mounting substrate 60A includes the first land electrode 671, the second land electrode 672, the ground terminal 713 (external connection terminal 711), and a plurality of (for example, five) via conductors 645. The first land electrode 671 is connected to the first input/output terminal 101. The second land electrode 672 is connected to the second input/output terminal 102. The ground terminal 713 is located on a side of the second main surface 62 rather than the first main surface 61 in the thickness direction D1 of the mounting substrate 60A. The plurality of via conductors 645 is disposed between the first main surface 61 and the second main surface 62, and connected to the ground terminal 713. The plurality of via conductors 645 is located between the first land electrode 671 and the second land electrode 672 in plan view from the thickness direction D1 of the mounting substrate 60A (see FIG. 10). Accordingly, the high-frequency module 1A according to Preferred Embodiment 2 can improve filter characteristics.

1. CONFIGURATION

Similarly to Preferred Embodiment 1, the first filter 11 is a band pass filter having a predetermined pass band. The predetermined pass band of the first filter 11 preferably corresponds to, for example, a frequency band in a 2.4 GHz band of Wi-Fi (registered trademark). The predetermined pass band is preferably, for example, included in a frequency band from about 2400 MHz to about 2483 MHz.

The second filter 12 has, for example, a pass band on a lower frequency side than the predetermined pass band of the first filter 11. The pass band on the lower frequency side than the predetermined pass band is preferably included in, for example, a frequency band from about 1710 MHz to about 2370 MHz. The second filter 12 is, for example, a mid-band filter. The second filter 12 is, for example, a band elimination filter, has a stopband in the predetermined pass band of the first filter 11, and has a pass band also on a higher frequency side than the predetermined pass band of the first filter 11. The pass band on the higher frequency side than the predetermined pass band is preferably included in, for example, a frequency band from about 2496 MHz to about 2690 MHz. It is sufficient that the second filter 12 has a pass band on at least one of the lower frequency side and the higher frequency side than the predetermined pass band of the first filter 11.

Figure 16:
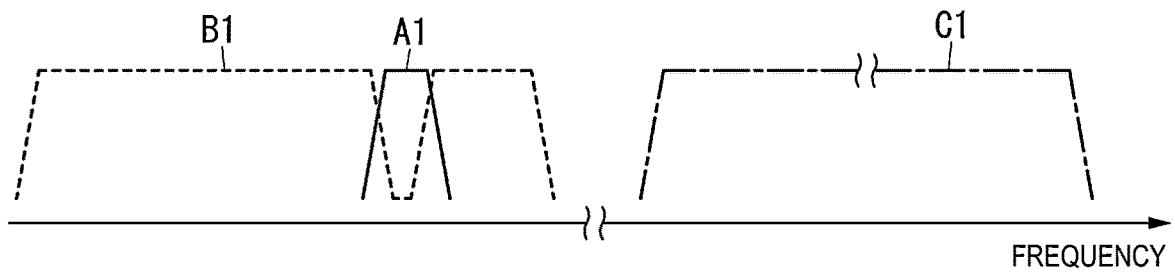
FIG. 16 is an explanatory diagram of filter bandpass characteristics of a first filter, a second filter, and a third filter in the high-frequency module according to Preferred Embodiment 2 of the present invention.

Further, the third filter 13, for example, has a pass band on a higher frequency side than the predetermined pass band of the first filter 11. The third filter 13 is, for example, an ultra-high band (UHB) filter. The pass band of the third filter 13 is preferably included in, for example, a frequency band from about 3300 MHz to about 5000 MHz. It is sufficient that the pass band of the third filter 13 is included in the frequency band from about 3300 MHz to about 5000 MHz, and the pass band of the third filter 13 may be, for example, from about 3400 MHz to about 3600 MHz. The pass band of the third filter 13 is located on a higher frequency side than the pass band of the second filter 12. In FIG. 16, filter characteristics of the first filter 11 are schematically illustrated by a solid line A1, filter characteristics of the second filter 12 are illustrated by a dashed line B1, and filter characteristics of the third filter 13 are schematically illustrated by a dashed-dotted line C1.

Figure 17:
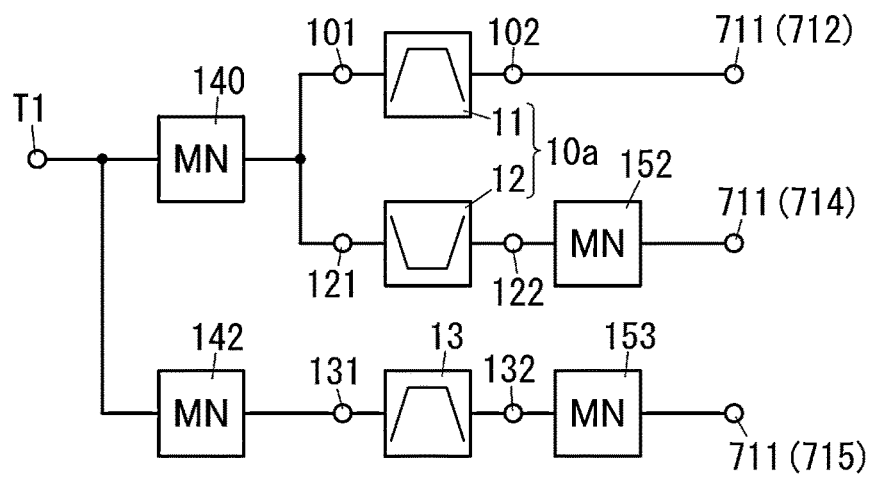
FIG. 17 is a circuit diagram of the filter according to Preferred Embodiment 2 of the present invention.

In the high-frequency module 1A of Preferred Embodiment 2, the one filter device 10a including the first filter 11 and the second filter 12, and the third filter 13 are mounted on the mounting substrate 60A. As illustrated in FIG. 17, the high-frequency module 1A defines a multiplexer that includes the first filter 11, the second filter 12, and the third filter 13. Here, the second filter 12 includes a first input/output terminal 121 and a second input/output terminal 122. Further, the third filter 13 includes a first input/output terminal 131 and a second input/output terminal 132.

The high-frequency module 1A of Preferred Embodiment 2 includes the plurality of external connection terminals 711. The plurality of external connection terminals 711 include the antenna terminal T1, the input/output terminal 712, input/output terminals 714, 715, and a plurality of the ground terminals 713 (see FIG. 10 and FIG. 15D). The antenna terminal T1 is connected to the first input/output terminal 101 of the first filter 11, the first input/output terminal 121 of the second filter 12, and the first input/output terminal 131 of the third filter 13. The input/output terminal 712 is connected to the second input/output terminal 102 of the first filter 11. The input/output terminal 714 is connected to the second input/output terminal 122 of the second filter 12. The input/output terminal 715 is connected to the second input/output terminal 132 of the third filter 13.

The high-frequency module 1A of Preferred Embodiment 2, similarly to Preferred Embodiment 1, may include, a first matching circuit connected between the second input/output terminal 102 of the first filter 11 and the input/output terminal 712.

Further, the high-frequency module 1A includes a matching circuit 152 connected between the second input/output terminal 122 of the second filter 12 and the input/output terminal 714. The matching circuit 152, for example, matches impedance between a circuit connected to a side opposite to a side of the second filter 12 at the input/output terminal 714, and the second filter 12.

Further, the high-frequency module 1A includes a matching circuit 153 connected between the second input/output terminal 132 of the third filter 13 and the input/output terminal 715. The matching circuit 153, for example, matches impedance between a circuit connected to a side opposite to a side of the third filter 13 at the input/output terminal 715, and the third filter 13.

2. STRUCTURE

Here, the structure of the high-frequency module 1A according to Preferred Embodiment 2, in particular, the structure of the mounting substrate 60A according to Preferred Embodiment 2 will be described.

Figure 10:
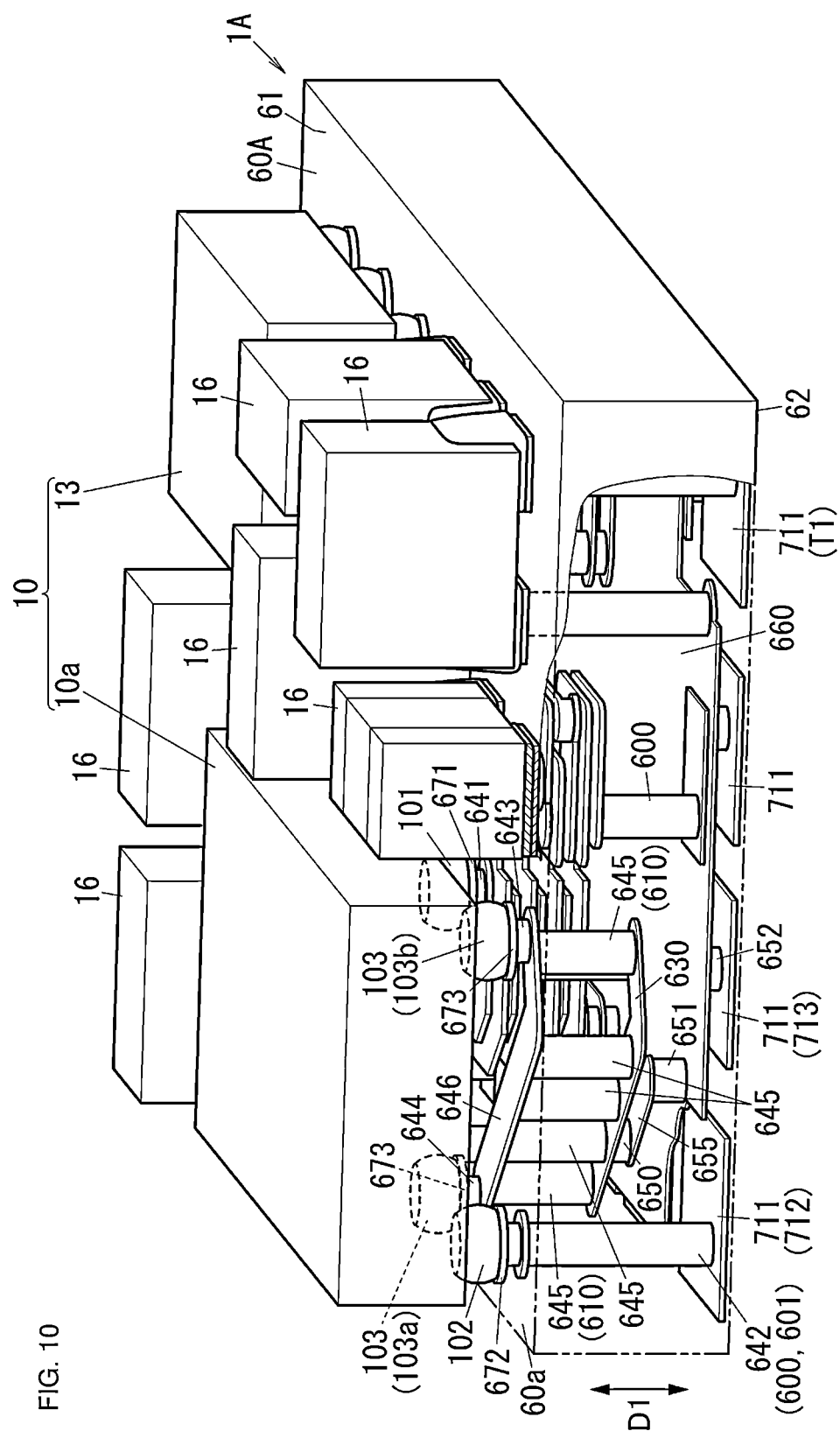
FIG. 10 is a diagram of a mounting substrate included in a high-frequency module according to Preferred Embodiment 2 of the present invention.
Figure 11:
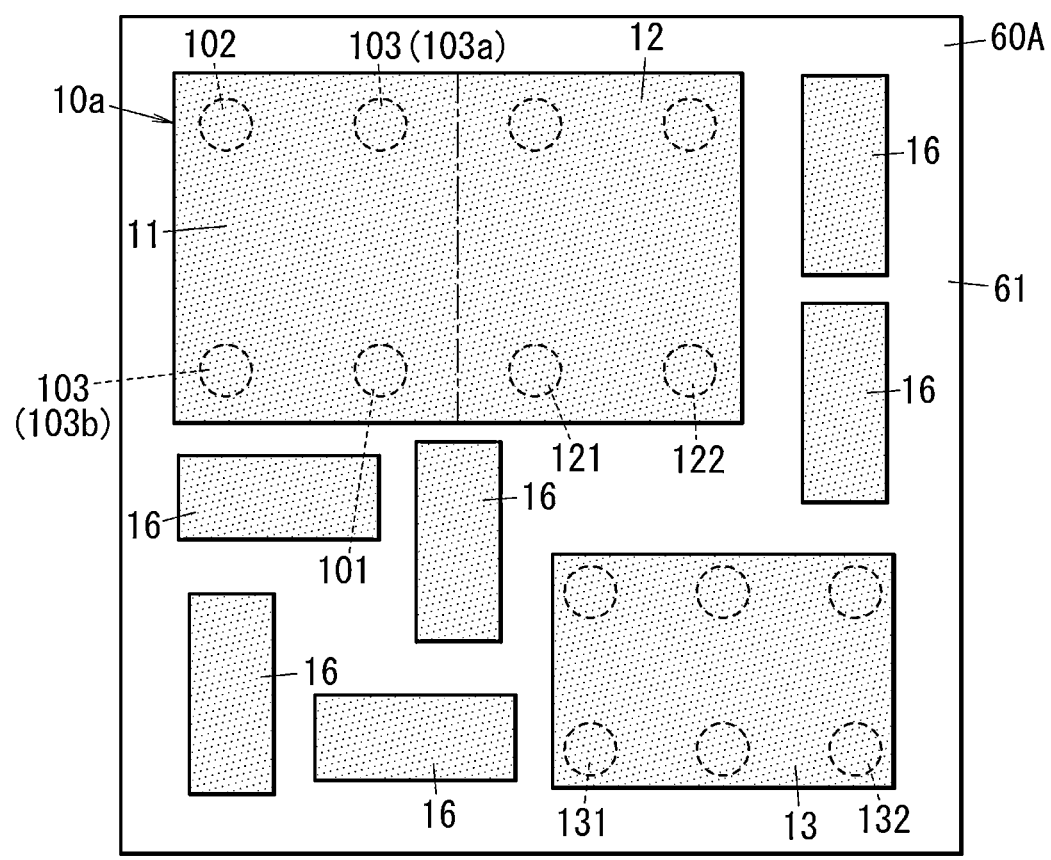
FIG. 11 is a plan view of the above mounting substrate.

As illustrated in FIG. 10 and FIG. 11, the high-frequency module 1A of Preferred Embodiment 2 includes the filter 10, a plurality of (six in the illustrated example) the electronic components 16, and the mounting substrate 60A. The mounting substrate 60A includes the antenna terminal T1. The filter 10 includes, similarly to Preferred Embodiment 1, the first filter 11, the second filter 12, and the third filter 13.

In the high-frequency module 1A of Preferred Embodiment 2, the first filter 11, the second filter 12, the third filter 13, and the plurality of electronic components 16 are disposed on the first main surface 61 of the mounting substrate 60A. The plurality of electronic components 16 include components (inductors, capacitors, and the like, for example) of matching circuits 141, 142, and the matching circuits 152, and 153.

Figure 13:
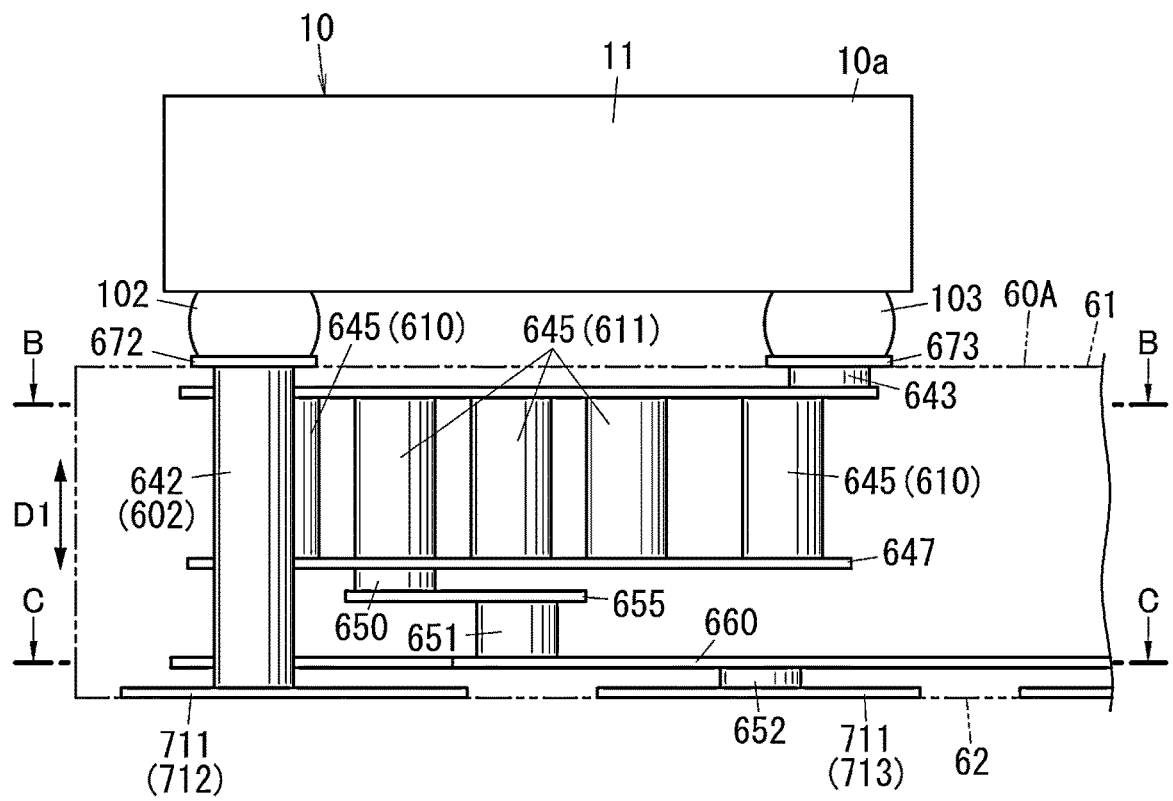
FIG. 13 is a partially broken side view of the above mounting substrate.

As illustrated in FIG. 10 and FIG. 13, the mounting substrate 60A includes the first main surface 61 and the second main surface 62 facing each other in the thickness direction D1 of the mounting substrate 60A. The mounting substrate 60A is preferably, for example, a multi-layer substrate including a plurality of (for example, 20 layers) dielectric layers and a plurality of (for example, 20 layers) conductive layers. The plurality of dielectric layers and the plurality of conductive layers are stacked in the thickness direction D1 of the mounting substrate 60A. Each of the plurality of conductive layers has a predetermined pattern defined for each layer. Each of the plurality of conductive layers includes one or a plurality of conductive portions in one plane orthogonal or substantially orthogonal to the thickness direction D1 of the mounting substrate 60A. A material of each conductive layer is preferably, for example, copper. The plurality of conductive layers include the first land electrode 671, the second land electrode 672, a plurality of the third land electrodes 673, the ground terminal 713, and the ground layer 660. As illustrated in FIG. 15D, the mounting substrate 60A includes a plurality of (for example, nine) the ground terminals 713. In the high-frequency module 1A of Preferred Embodiment 2, the plurality of ground terminals 713 is connected to the ground layer 660 by a plurality of (for example, 15) via conductors 652 (see FIG. 10 and FIG. 13) included in the mounting substrate 60A.

The first main surface 61 and the second main surface 62 of the mounting substrate 60A are separated from each other in the thickness direction D1 of the mounting substrate 60A, and intersect the thickness direction D1 of the mounting substrate 60A. The first main surface 61 of the mounting substrate 60A is, for example, orthogonal or substantially orthogonal to the thickness direction D1 of the mounting substrate 60A, but for example, may include a side surface or the like of a conductive portion as a surface not orthogonal or substantially orthogonal to the thickness direction D1. Further, the second main surface 62 of the mounting substrate 60A is, for example, orthogonal or substantially orthogonal to the thickness direction D1 of the mounting substrate 60A, but may include, for example, a side surface or the like of a conductive portion as a surface not orthogonal or substantially orthogonal to the thickness direction D1. Further, the first main surface 61 and the second main surface 62 of the mounting substrate 60A may have fine irregularities or concave portions or convex portions. In plan view from the thickness direction D1 of the mounting substrate 60A, the mounting substrate 60A has, for example, a square substantially square shape, but is not limited thereto, and, for example, may have a rectangular shape or a polygonal shape other than a quadrangular shape.

The first filter 11, the second filter 12, the third filter 13, and the plurality of electronic components 16 are mounted on the mounting substrate 60A. Here, being mounted on the mounting substrate 60A includes being disposed on (mechanically connected to) the mounting substrate 60A and being electrically connected to (an appropriate conductive portion of) the mounting substrate 60A. The high-frequency module 1A of the present preferred embodiment may include a circuit element provided in the mounting substrate 60A.

Figure 12:
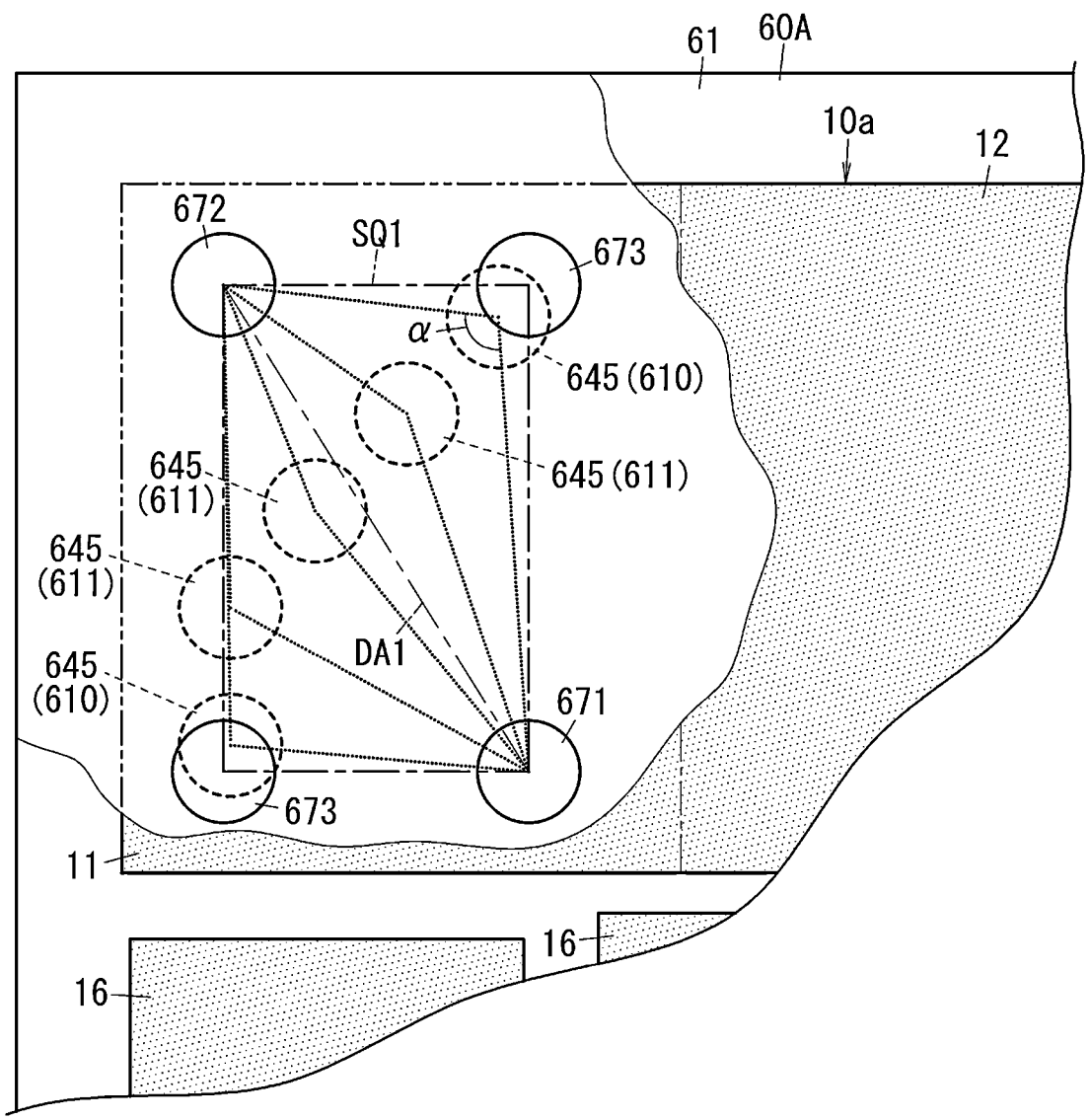
FIG. 12 is a partially broken plan view of the above mounting substrate.

The first filter 11 includes the first input/output terminal 101, the second input/output terminal 102, and a plurality of (here, two) the ground terminals 103. Further, each of the electronic components 16 is a surface-mounted inductor or surface-mounted capacitor, and includes two electrodes. On the other hand, as illustrated in FIG. 10 and FIG. 12, the mounting substrate 60A further includes the plurality of (here, two) third land electrodes 673 connected to the plurality of ground terminals 103 respectively. Further, the mounting substrate 60A includes two land electrodes to which two electrodes of the electronic component 16 are connected respectively, for each of the plurality of (six) electronic components 16. That is, the mounting substrate 60A includes the 12 land electrodes. Note that, a shape of each of the plurality of (12) land electrodes is, for example, quadrangular or substantially quadrangular in plan view from the thickness direction D1 of the mounting substrate 60A, similarly to respective shapes of the first land electrode 671, the second land electrode 672, and the plurality of third land electrodes 673.

Figure 15A:
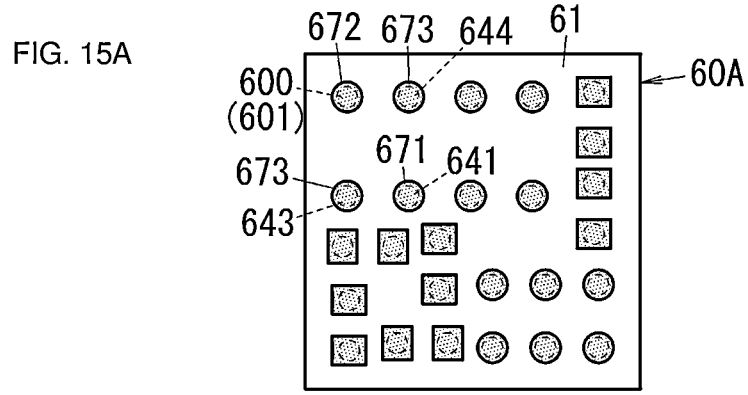
FIG. 15A is a plan view of the above mounting substrate.
Figure 15B:
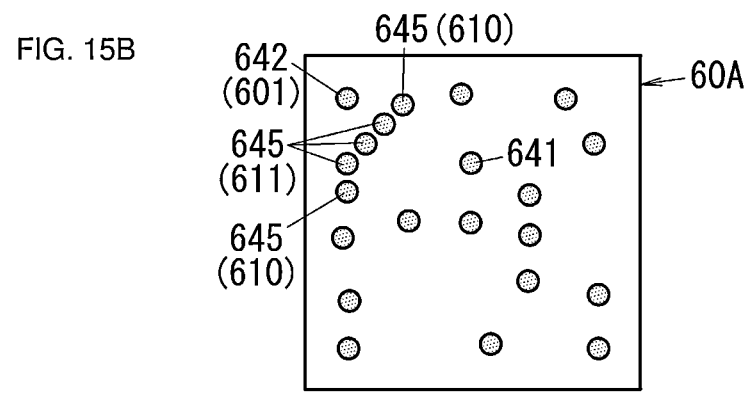
FIG. 15B illustrates the above mounting substrate, and is a sectional view taken along a line B-B in FIG. 13.
Figure 15C:
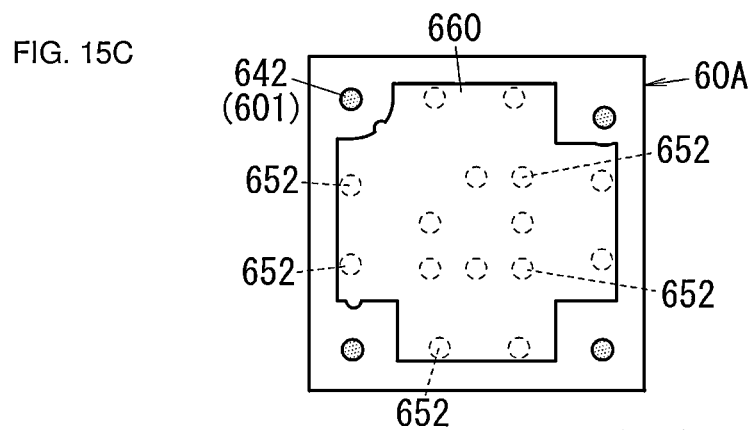
FIG. 15C illustrates the above mounting substrate, and is a sectional view taken along a line C-C in FIG. 13.
Figure 15D:
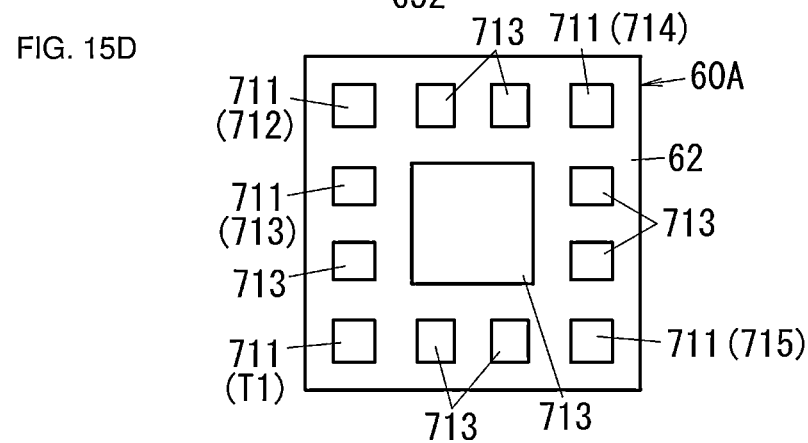
FIG. 15D illustrates the above mounting substrate, and is a plan view in which a second main surface is seen through from a side of a first main surface of the mounting substrate.

In the mounting substrate 60A of Preferred Embodiment 2, as illustrated in FIG. 15A, the second land electrode 672 is disposed at the one corner portion 60a (see FIG. 10) of the first main surface 61 of the mounting substrate 60A in plan view from the thickness direction D1 of the mounting substrate 60A. In addition, in the mounting substrate 60A, the plurality of third land electrodes 673, and the second land electrode 672 are arranged in a direction along an outer periphery of the mounting substrate 60A in plan view of the mounting substrate 60A. In the mounting substrate 60A of Preferred Embodiment 2, as illustrated in FIG. 12, in plan view from the thickness direction D1 of the mounting substrate 60A, the first land electrode 671, the second land electrode 672, and the plurality of third land electrodes 673 are respectively located at four vertices of a rectangle SQ1 having a straight line DA1 connecting a center of the first land electrode 671 and a center of the second land electrode 672 as one diagonal line. A center of each of the plurality of third land electrodes 673 coincides with the vertex of the rectangle SQ1, but the present invention is not limited thereto, and the center may be displaced.

Figure 14:
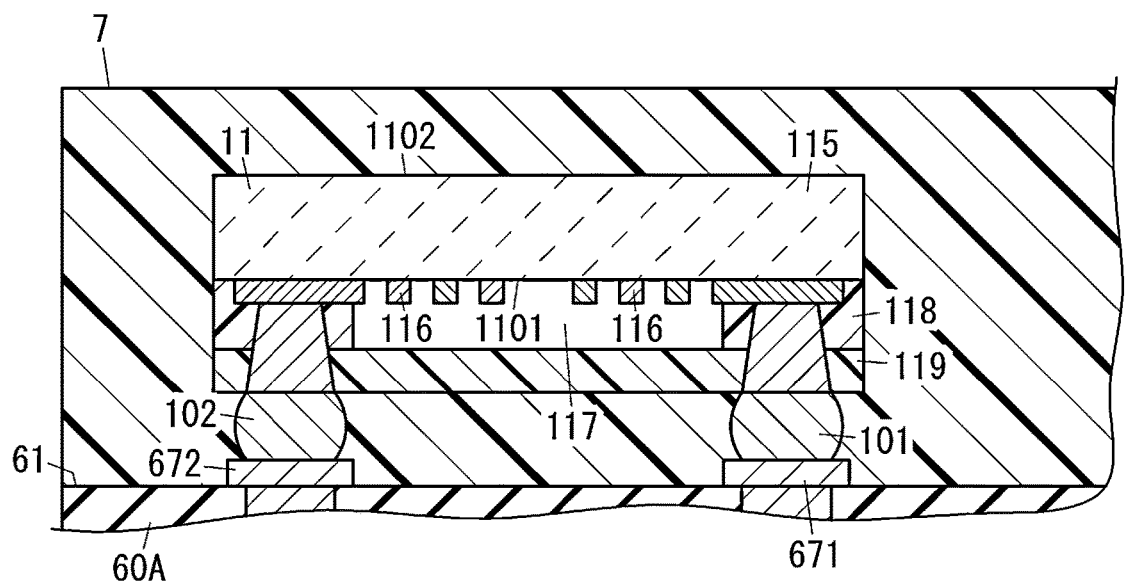
FIG. 14 is a partially broken sectional view of the above mounting substrate.

As illustrated in FIG. 14, the first filter 11 includes a piezoelectric substrate 115, a plurality of (for example, nine) interdigital transducer (IDT) electrodes 116, the first input/output terminal 101, the second input/output terminal 102, and the two ground terminals 103. The piezoelectric substrate 115 includes a first main surface 1101 and a second main surface 1102 facing each other. The IDT electrode 116 is provided on the first main surface 1101 of the piezoelectric substrate 115. A material of the piezoelectric substrate is preferably, for example, lithium tantalate or lithium niobate.

Further, the first filter 11 includes, as components of a package structure, a spacer layer 118, a cover member 119, the first input/output terminal 101, the second input/output terminal 102, and the two ground terminals 103.

The spacer layer 118 and the cover member 119 are provided on a side of the first main surface 1101 of the piezoelectric substrate 115. The spacer layer 118 surrounds the plurality of IDT electrodes 116 in plan view from the thickness direction D1 of the mounting substrate 60A. In plan view from the thickness direction D1 of the mounting substrate 60A, the spacer layer 118 has, for example, a rectangular or substantially rectangular frame shape. The spacer layer 118 has an electrical insulation property. A material of the spacer layer 118 is preferably, for example, an epoxy resin, polyimide, or the like. The cover member 119 has a flat or substantially flat plate shape. The cover member 119 is disposed on the spacer layer 118 so as to face the piezoelectric substrate 115 in the thickness direction D1 of the mounting substrate 60A. The cover member 119 overlaps the plurality of IDT electrodes 116 in the thickness direction D1 of the mounting substrate 60A, and is spaced from the plurality of IDT electrodes 116 in the thickness direction D1 of the mounting substrate 60A. The cover member 119 has an electrical insulation property. A material of the cover member 119 is an epoxy resin, polyimide, or the like. The first filter 11 includes a space 117 surrounded by the piezoelectric substrate 115, the spacer layer 118, and the cover member 119. In the first filter 11, a gas is contained in the space 117. The gas is air, an inert gas (for example, nitrogen gas), or the like, for example.

The first input/output terminal 101, the second input/output terminal 102, and the two ground terminals 103 in the first filter 11 are exposed from the cover member 119. Each of the first input/output terminal 101, the second input/output terminal 102, and the two ground terminals 103 is, for example, a bump. Each bump is, for example, a solder bump. Each bump is not limited to a solder bump, and may be, for example, a gold bump.

As illustrated in FIG. 10 and FIG. 11, the second filter 12 includes the first input/output terminal 121 and the second input/output terminal 122. In the high-frequency module 1A according to Preferred Embodiment 2, the piezoelectric substrate 115 is shared by the first filter 11 and the second filter 12, and the filter device 10a as one package is disposed on the first main surface 61 of the mounting substrate 60A. The fact that the filter 10 is disposed on the first main surface 61 of the mounting substrate 60A means that the first filter 11 and the second filter 12 are disposed on the first main surface 61 of the mounting substrate 60A. Here, the filter device 10a is mounted on the first main surface 61 of the mounting substrate 60A.

The filter device 10a has, for example, a rectangular or substantially rectangular shape in plan view from the thickness direction D1 of the mounting substrate 60A. In the filter device 10a, in plan view from the thickness direction D1 of the mounting substrate 60A, a half in a longitudinal direction defines the first filter 11, and a remaining portion defines the second filter 12. A ratio of an area occupied by the first filter 11 and an area occupied by the second filter 12 in the filter device 10a in plan view from the thickness direction D1 of the mounting substrate 60A is preferably, for example, approximately 1:1, but the present invention is not limited thereto. In the first filter 11, in plan view from the thickness direction D1 of the mounting substrate 60A, the second input/output terminal 102 and a ground terminal 103a are arranged along one long side of two long sides of the filter device 10a, a ground terminal 103b and the first input/output terminal 101 are arranged along another long side, and the second input/output terminal 102 and the ground terminal 103b are arranged along one short side of two short sides. Further, in the first filter 11, in plan view from the thickness direction D1 of the mounting substrate 60A, the second input/output terminal 102 is located at one corner portion of four corner portions of the filter device 10a.

As illustrated in FIG. 11 and FIG. 17, the third filter 13 includes the first input/output terminal 131 and the second input/output terminal 132. The third filter 13 is disposed on the first main surface 61 of the mounting substrate 60A. Here, the third filter 13 is mounted on the first main surface 61 of the mounting substrate 60A. The third filter 13 has, for example, a rectangular or substantially rectangular shape in plan view from the thickness direction D1 of the mounting substrate 60A, and is separated from the first filter 11 and the second filter 12.

The plurality of electronic components 16 are disposed on the first main surface 61 of the mounting substrate 60A. Here, the plurality of electronic components 16 are mounted on the first main surface 61 of the mounting substrate 60A.

As described above, the mounting substrate 60A of Preferred Embodiment 2 includes the first land electrode 671, the second land electrode 672, the ground terminal 713, and the plurality of (for example, five) via conductors 645. The first land electrode 671 is connected to the first input/output terminal 101. The second land electrode 672 is connected to the second input/output terminal 102. The ground terminal 713 is located on a side of the second main surface 62, rather than the first main surface 61 in the thickness direction D1 of the mounting substrate 60A. The plurality of via conductors 645 is disposed between the first main surface 61 and the second main surface 62, and connected to the ground terminal 713.

Each of the plurality of via conductors 645 has, for example, a columnar or substantially columnar shape. Each of the plurality of via conductors 645 is disposed along the thickness direction D1 of the mounting substrate 60A. Each of the plurality of via conductors 645 has, for example, a circular or substantially circular shape in plan view from the thickness direction D1 of the mounting substrate 60A.

As illustrated in FIG. 10, the mounting substrate 60A includes a via conductor 643 connected to the third land electrode 673, a via conductor 644 connected to the third land electrode 673, and an inner layer wiring portion 646 connecting the two via conductors 643, 644, and the five via conductors 645. Accordingly, the two ground terminals 103 of the first filter 11 are electrically connected to the five via conductors 645. The inner layer wiring portion 646 overlaps the via conductor 643, the via conductor 644, and the five via conductors 645 in the thickness direction D1 of the mounting substrate 60A. The inner layer wiring portion 646 connects the five via conductors 645 on a side of the first main surface 61 of the mounting substrate 60A.

Further, the mounting substrate 60A includes the first wiring portion 630 (hereinafter referred to as an inner layer wiring portion 630) to which the five via conductors 645 are connected on a side of the second main surface 62 of the mounting substrate 60A. The inner layer wiring portion 630 overlaps the five via conductors 645 in the thickness direction D1 of the mounting substrate 60A.

As illustrated in FIG. 15D, the high-frequency module 1A according to Preferred Embodiment 2 includes a plurality of (for example, nine) the ground terminals 713. A surface of each of the plurality of ground terminals 713 defines a portion of the second main surface 62.

The mounting substrate 60A further includes the ground layer 660 connected to the plurality of (five) via conductors 645 and the plurality of (nine) ground terminals 713. The ground layer 660 is located between the five via conductors 645 and the nine ground terminals 713 in the thickness direction D1 of the mounting substrate 60A.

The ground layer 660 overlaps the five via conductors 645 and the nine ground terminals 713 in plan view from the thickness direction D1. In the mounting substrate 60A, in the thickness direction D1 of the mounting substrate 60A, a distance between the ground layer 660 and the second main surface 62 is shorter than a distance between the ground layer 660 and the first main surface 61. In the thickness direction D1 of the mounting substrate 60A, a length of each of the five via conductors 645 is shorter than a distance between the first main surface 61 and the second main surface 62, and is longer than the distance between the ground layer 660 and the second main surface 62. The length of each of the five via conductors 645 is longer than a length of each of the via conductor 643 and the via conductor 644. In the high-frequency module 1A according to Preferred Embodiment 2, the lengths of the respective five via conductors 645 are the same or substantially as each other, but may be different from each other. The five via conductors 645 and the ground layer 660 are electrically connected to each other with the via conductor 650 connected to the inner layer wiring portion 630, the second wiring portion 655 (hereinafter referred to as an inner layer wiring portion 655) connected to the via conductor 650, and the via conductor 651 connected to the inner layer wiring portion 655 interposed therebetween.

In the high-frequency module 1A of Preferred Embodiment 2, an area of the ground layer 660 is larger than an area of the filter 10 in plan view from the thickness direction D1 of the mounting substrate 60A. The ground layer 660 does not overlap the antenna terminal T1 and the input/output terminals 712, 714, and 715 in plan view from the thickness direction D1 of the mounting substrate 60A.

The high-frequency module 1A according to Preferred Embodiment 2 further includes the via conductor 652 that is different from the plurality of via conductors 645, located between the ground layer 660 and the ground terminal 713 in the thickness direction D1 of the mounting substrate 60A, and connects the ground layer 660 and the ground terminal 713. In the high-frequency module 1A of Preferred Embodiment 2, a size of the ground terminal 713, of the nine ground terminals 713, located at a center portion in plan view in the thickness direction D1 of the mounting substrate 60A is larger than sizes of the respective other eight ground terminals 713. The ground terminal 713 located at the center portion and the ground layer 660 are connected to each other by a plurality of (for example, seven) via conductors 652, and each of the other eight ground terminals 713 is connected to the ground layer 660 by the one via conductor 652.

As illustrated in FIG. 12, the plurality of via conductors 645 are located between the first land electrode 671 and the second land electrode 672 in plan view from the thickness direction D1 of the mounting substrate 60A. "Being located between the first land electrode 671 and the second land electrode 672" means that in plan view from the thickness direction D1 of the mounting substrate 60A, a center portion of each of the plurality of via conductors 645 is located inside the rectangle SQ1 having the straight line DA1 connecting the center portion of the first land electrode 671 and the center portion of the second land electrode 672 as one diagonal line. Here, with respect to the via conductors 645, of the plurality of via conductors 645, not on the straight line DA1, in a virtual triangle with the center portion of the first land electrode 671 and the center portion of the via conductor 645 and the center portion of the second land electrode 672 as respective vertices, a vertex angle α at the vertex corresponding to the center portion of the via conductor 645 is preferably larger than about 90 degrees and smaller than about 180 degrees, for example. In the plurality of via conductors 645, the via conductor 645 closest to the via conductor 643 and the via conductor 645 closest to the via conductor 644 correspond to the via conductors 610 of Preferred Embodiment 1.

A distance between the two via conductors 645, of the plurality of via conductors 645, adjacent to each other is preferably, for example, equal to or less than about one quarter of a wavelength of a radio wave at a center frequency of a predetermined pass band. The predetermined pass band is included in, for example, a frequency band from about 2400 MHz to about 2483 MHz. The center frequency of the predetermined pass band is, for example, about 2441.5 MHz.

As illustrated in FIG. 10, FIG. 14, and FIGS. 15A to 15C, the mounting substrate 60A further includes a first wiring portion 641 connected to the first land electrode 671, and a second wiring portion 642 connected to the second land electrode 672. The second wiring portion 642 corresponds to the via conductor 600 (601) of Preferred Embodiment 1. The plurality of via conductors 645 are located between the first wiring portion 641 and the second wiring portion 642, in plan view from the thickness direction D1 of the mounting substrate 60A (see FIG. 15B). The first wiring portion 641 includes a plurality of wiring via conductors and a plurality of inner layer wiring portions. The second wiring portion 642 includes a wiring via conductor that connects the second land electrode 672 and the input/output terminal 712.

The high-frequency module 1A of Preferred Embodiment 2 further includes a resin layer 7 (see FIG. 14). The resin layer 7 covers a plurality of circuit elements disposed on the first main surface 61 of the mounting substrate 60A on a side of the first main surface 61 of the mounting substrate 60A. Here, the resin layer 7 seals the plurality of circuit elements disposed on the first main surface 61 of the mounting substrate 60A. The plurality of circuit elements disposed on the first main surface 61 of the mounting substrate 60A includes the first filter 11, the second filter 12, the third filter 13, and a plurality of the electronic components 16. The resin layer 7 preferably includes resin, for example. The resin layer 7 may include a filler, in addition to the resin.

Further, the high-frequency module 1A of Preferred Embodiment 2 may further include a shield layer. A material of the shield layer is, for example, metal. The shield layer covers, for example, a main surface and an outer peripheral surface of the resin layer 7, and an outer peripheral surface of the mounting substrate 60A.

3. CHARACTERISTICS OF HIGH-FREQUENCY MODULE

Figure 18:
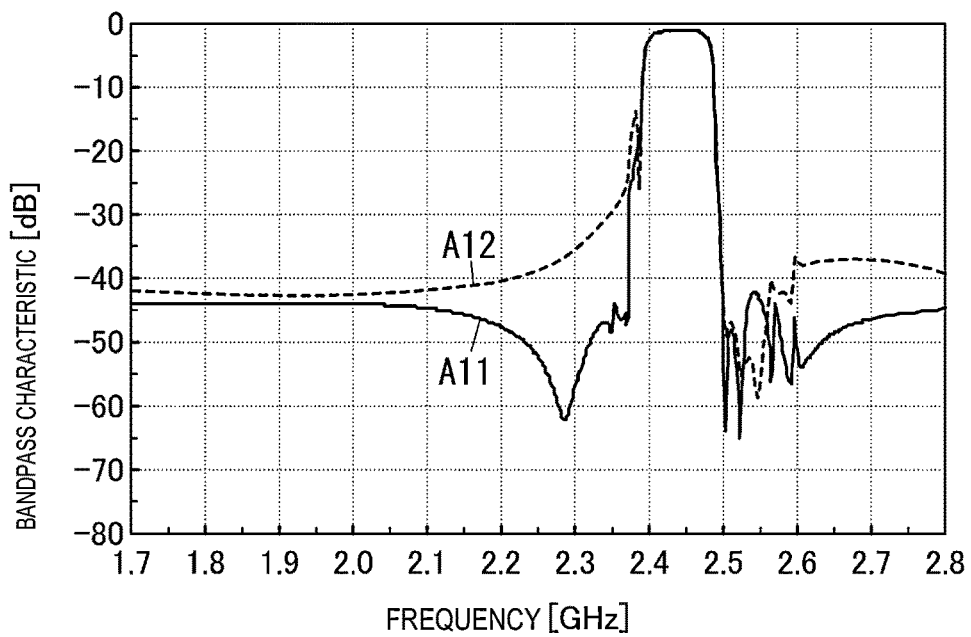
FIG. 18 is a graph illustrating filter bandpass characteristics of the first filter in the above high-frequency module, and filter bandpass characteristics of a first filter in a high-frequency module according to a comparative example.

FIG. 18 is a graph illustrating filter bandpass characteristics A11 of the first filter 11 in the high-frequency module 1A according to Preferred Embodiment 2, and filter bandpass characteristics A12 of a first filter in a high-frequency module according to a comparative example. The high-frequency module according to the comparative example is different from the high-frequency module 1A according to Preferred Embodiment 2 in that the plurality of via conductors 645 of the high-frequency module 1A according to Preferred Embodiment 2 are not included.

From FIG. 18, it can be seen that, in the high-frequency module 1A according to Preferred Embodiment 2, as compared with the high-frequency module according to the comparative example, filter bandpass characteristics can be obtained in which high attenuation occurs on a low frequency side and a high frequency side of the predetermined pass band of the first filter 11.

Figure 19:
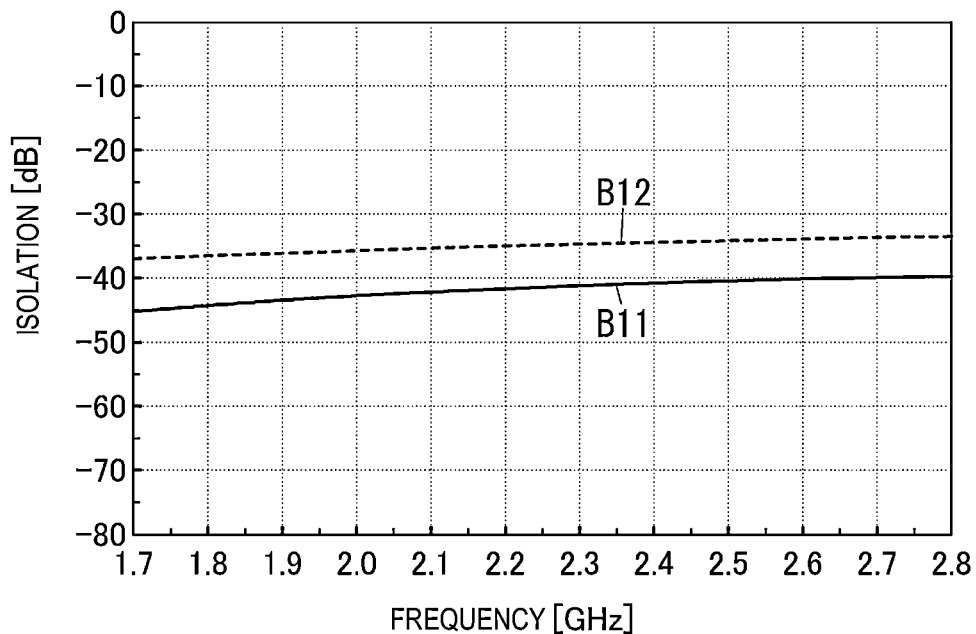
FIG. 19 is a graph illustrating isolation characteristics between a first input/output terminal and a second input/output terminal of the first filter in the above high-frequency module, and isolation characteristics between a first input/output terminal and a second input/output terminal of the first filter in the high-frequency module according to the comparative example.

FIG. 19 is a graph illustrating isolation characteristics B11 between the first input/output terminal and the second input/output terminal of the first filter 11 in the high-frequency module according to Preferred Embodiment 2, and isolation characteristics B12 between a first input/output terminal and a second input/output terminal of the first filter in the high-frequency module according to the comparative example.

From FIG. 19, it can be seen that in the high-frequency module 1A according to Preferred Embodiment 1, as compared with the high-frequency module according to the comparative example, isolation between the first input/output terminal 101 and the second input/output terminal 102 can be improved at least in a frequency band from about 1.7 GHz to about 2.8 GHz, which includes the predetermined pass band of the first filter 11.

4. ADVANTAGES

The high-frequency module 1A according to Preferred Embodiment 2 includes the mounting substrate 60A and the first filter 11. The mounting substrate 60A includes the first main surface 61 and the second main surface 62 facing each other. The first filter 11 includes the first input/output terminal 101 and the second input/output terminal 102, and is disposed on the first main surface 61 of the mounting substrate 60A. The mounting substrate 60A includes the first land electrode 671, the second land electrode 672, the ground terminal 713, and the plurality of via conductors 645. The first land electrode 671 is connected to the first input/output terminal 101. The second land electrode 672 is connected to the second input/output terminal 102. The ground terminal 713 is located on the side of the second main surface 62 rather than the first main surface 61 in the thickness direction D1 of the mounting substrate 60A. The plurality of via conductors 645 are disposed between the first main surface 61 and the second main surface 62, and connected to the ground terminal 713. The plurality of via conductors 645 are located between the first land electrode 671 and the second land electrode 672 in plan view from the thickness direction D1 of the mounting substrate 60A.

With the high-frequency module 1A according to Preferred Embodiment 2, the filter characteristics of the first filter 11 can be improved.

Here, in the high-frequency module 1A according to Preferred Embodiment 2, the isolation between the first input/output terminal 101 and the second input/output terminal 102 of the first filter 11 is improved, and the filter characteristics of the first filter 11 are improved. In the high-frequency module 1A according to Preferred Embodiment 2, by providing the plurality of via conductors 645, it is possible to reduce or prevent electromagnetic field coupling between the first input/output terminal 101 and the second input/output terminal 102 of the first filter 11 with the mounting substrate 60A interposed therebetween. Accordingly, with the high-frequency module 1A according to Preferred Embodiment 2, the isolation can be improved, and filter characteristics with high attenuation can be achieved.

In addition, in the high-frequency module 1A according to Preferred Embodiment 2, the plurality of via conductors 645 are located between the first wiring portion 641 and the second wiring portion 642 in plan view from the thickness direction D1 of the mounting substrate 60A. Accordingly, in the high-frequency module 1A according to Preferred Embodiment 2, electromagnetic field coupling between the first wiring portion 641 and the second wiring portion 642 can be reduced or prevented, and the filter characteristics can be further improved.

Further, the communication device 500 according to Preferred Embodiment 2 includes the high-frequency module 1A and the signal processing circuit 3 according to Preferred Embodiment 2. The signal processing circuit 3 performs signal processing on a high-frequency signal that passes through the first filter 11 of the high-frequency module 1A.

Since the communication device 500 according to Preferred Embodiment 2 includes the high-frequency module 1A, it is possible to improve the filter characteristics of the first filter 11.

The plurality of electronic components defining the signal processing circuit 3 may be, for example, mounted on a circuit board (second circuit board) different from the circuit board (first circuit board) on which the high-frequency module 1A is mounted.

5. MODIFIED EXAMPLES

5.1. Modified Example 1

Figure 20:
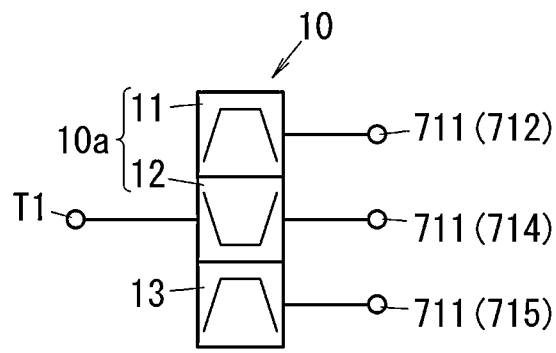
FIG. 20 is a circuit diagram of a high-frequency module according to Modified Example 1 of Preferred Embodiment 2 of the present invention.

The high-frequency module 1 according to Modified Example 1 of Preferred Embodiment 2 of the present invention will be described with reference to FIG. 20. With respect to the high-frequency module 1 according to Modified Example 1, the same or similar components to those of the high-frequency module 1 according to Preferred Embodiment 1 are denoted by the same reference numerals, and the description thereof will be omitted.

The high-frequency module 1 according to Modified Example 1 is different from the high-frequency module 1A according to Preferred Embodiment 2 in that a band pass filter corresponding to an L5 band of a satellite positioning system (GNSS) is used as the third filter 13. The L5 band is from about 1164.4 MHz to about 1187.95 MHz. The third filter 13 may be a band pass filter corresponding to an L1 band, not limited to the L5 band of the GNSS. The L1 band is from about 1559 MHz to about 1606 MHz. Further, the third filter 13 may support a frequency band in a 5 GHz band for Wi-Fi (registered trademark). The frequency band in the 5 GHz band for Wi-Fi (registered trademark) is from about 5150 MHz to about 7125 MHz.

Further, the high-frequency module 1 according to Modified Example 1 is different from the high-frequency module according to Preferred Embodiment 1, also in that the plurality of (for example, four) matching circuits 140, 142, 152, and 153 is not provided.

5.2. Modified Example 2

Figure 21:
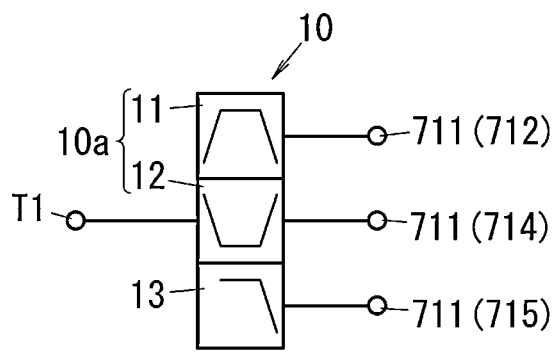
FIG. 21 is a circuit diagram of a high-frequency module according to Modified Example 2 of Preferred Embodiment 2 of the present invention.

The high-frequency module 1 according to Modified Example 2 of Preferred Embodiment 2 of the present invention will be described with reference to FIG. 21. With respect to the high-frequency module 1 according to Modified Example 2, the same or similar components to those of the high-frequency module 1 according to Preferred Embodiment 1 are denoted by the same reference numerals, and the description thereof will be omitted.

The high-frequency module 1 according to Modified Example 2 is different from the high-frequency module 1 according to Preferred Embodiment 1, in that a low pass filter as the third filter 13 is used that has a pass band on a lower frequency side than the first filter 11. The pass band of the third filter 13 of Modified Example 2 is preferably, for example, from about 617 MHz to about 960 MHz.

Further, the high-frequency module 1 according to Modified Example 2 is different from the high-frequency module according to Preferred Embodiment 1, also in that the plurality of (for example, four) matching circuits 140, 142, 152, and 153 is not provided.

5.3. Modified Example 3

A high-frequency module 1B according to Modified Example 3 of Preferred Embodiment 2 of the present invention will be described with reference to FIG. 22 to FIG. 25D. The high-frequency module 1B according to Modified Example 3 is different from the high-frequency module 1A according to Preferred Embodiment 2 in that a mounting substrate 60B is provided in place of the mounting substrate 60A in the high-frequency module 1A according to Preferred Embodiment 2. With respect to the high-frequency module 1B according to Modified Example 3, the same or similar components to those of the high-frequency module 1A according to Preferred Embodiment 2 are denoted by the same reference numerals, and the description thereof will be omitted.

Further, the high-frequency module 1B according to Modified Example 3 differs from the high-frequency module 1A according to Preferred Embodiment 2, in that, for example, the seven electronic components 16 are provided. The high-frequency module 1B according to Modified Example 3 does not include the third filter 13 in the high-frequency module 1A according to Preferred Embodiment 2, but an LC filter corresponding thereto is defined by the electronic component 16 and the mounting substrate 60B.

Figure 22:
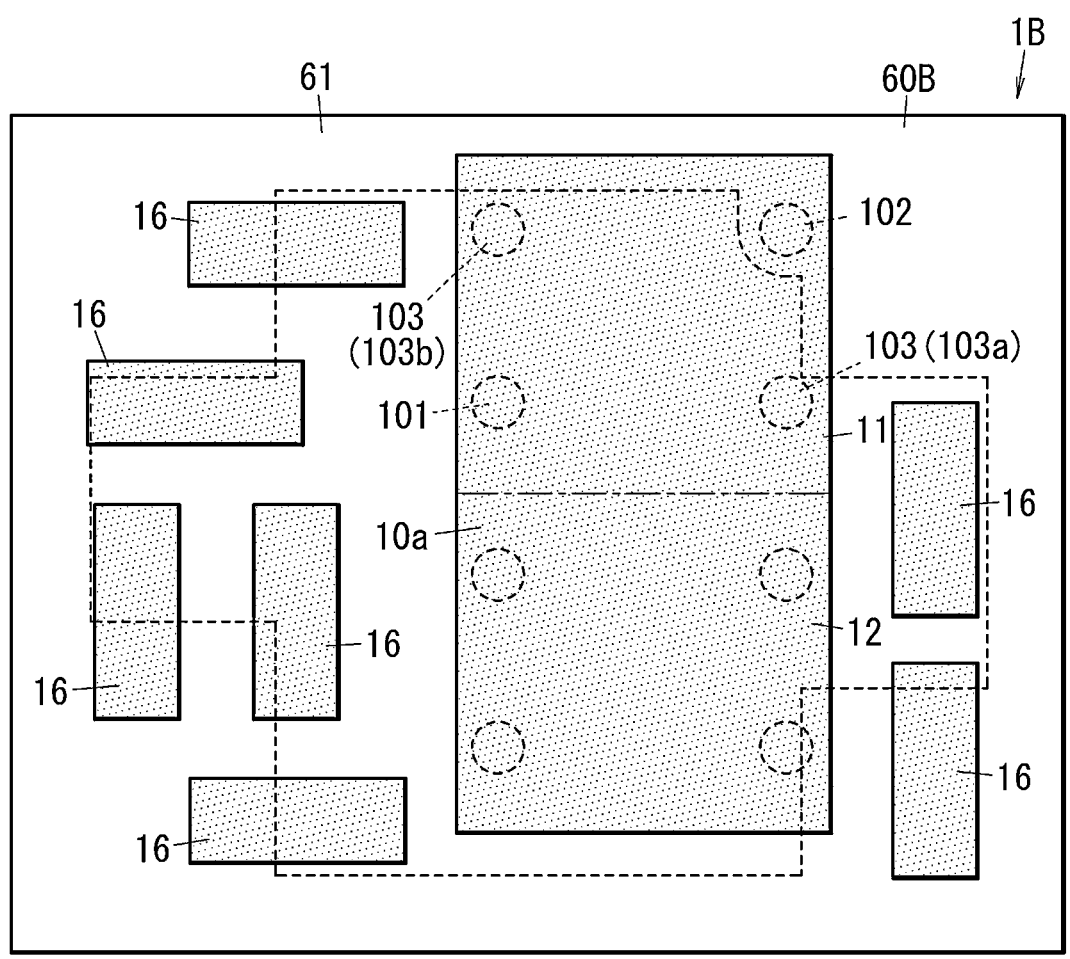
FIG. 22 is a plan view of a mounting substrate included in a high-frequency module according to Modified Example 3 of Preferred Embodiment 2 of the present invention.
Figure 23:
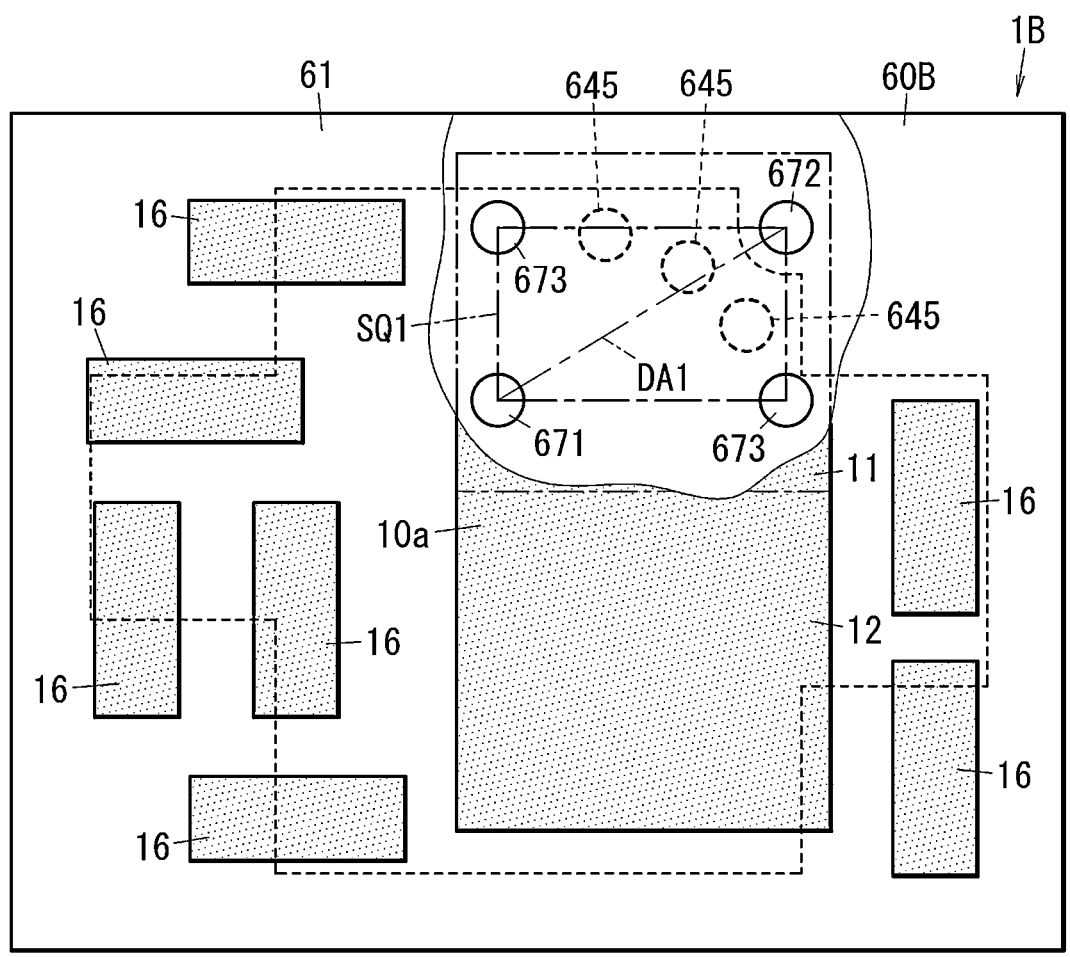
FIG. 23 is a partially broken plan view of the above mounting substrate.
Figure 24:
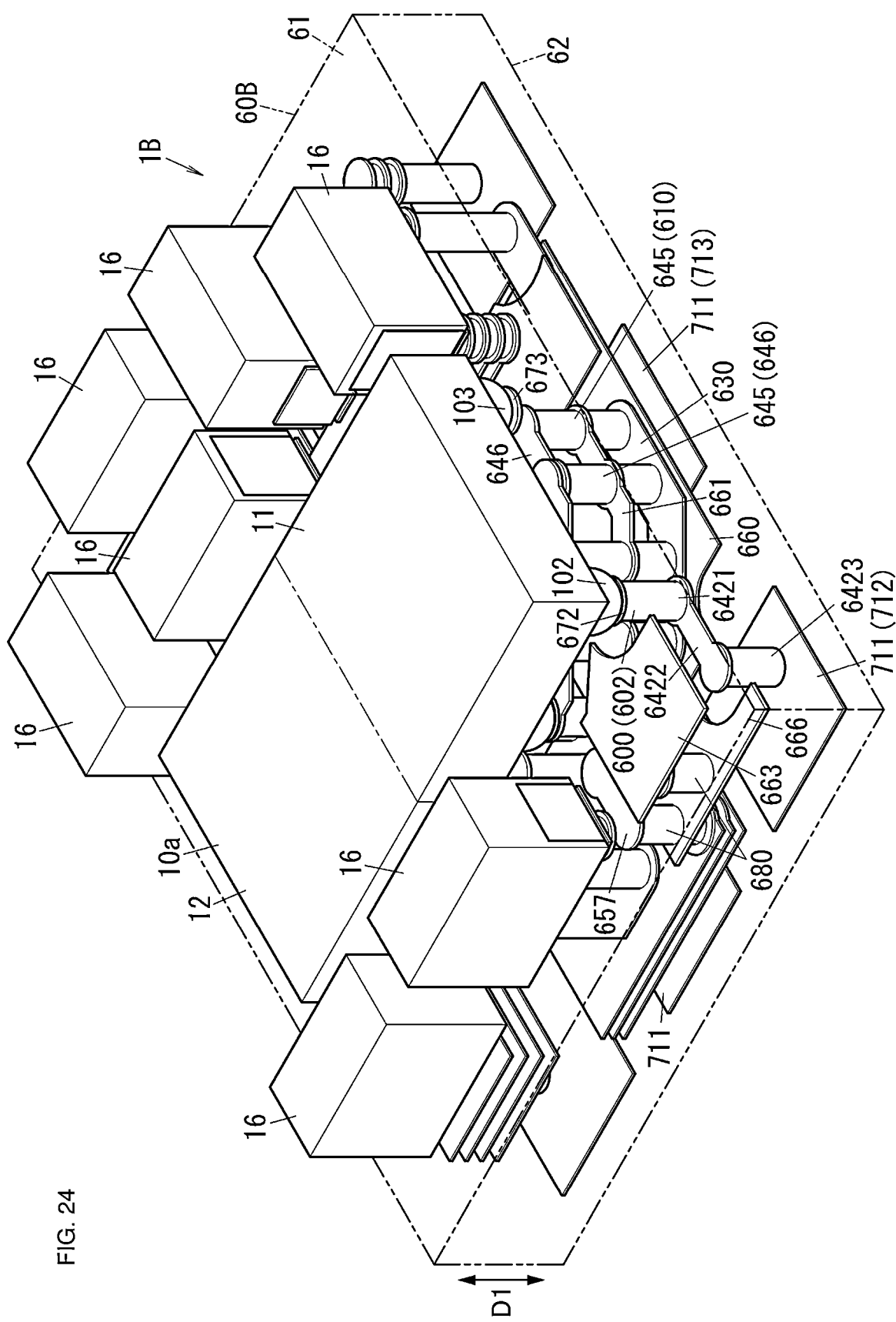
FIG. 24 is a perspective view of the above mounting substrate.
Figure 25A:
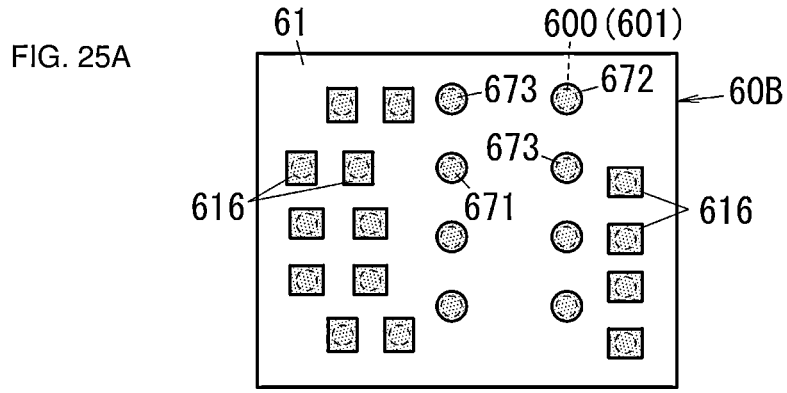
FIG. 25A is a plan view of the above mounting substrate.
Figure 25B:
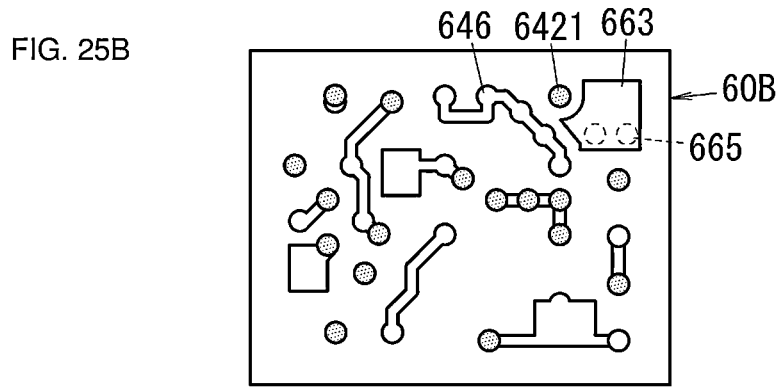
FIG. 25B is a cross-sectional view of the above mounting substrate.
Figure 25C:
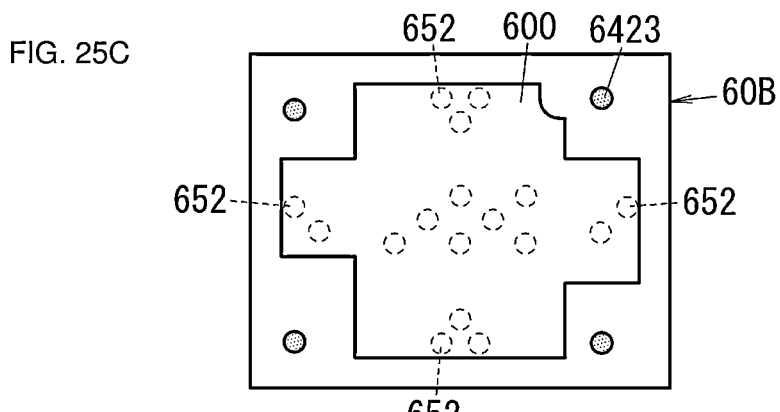
FIG. 25C is another cross-sectional view of the above mounting substrate.
Figure 25D:
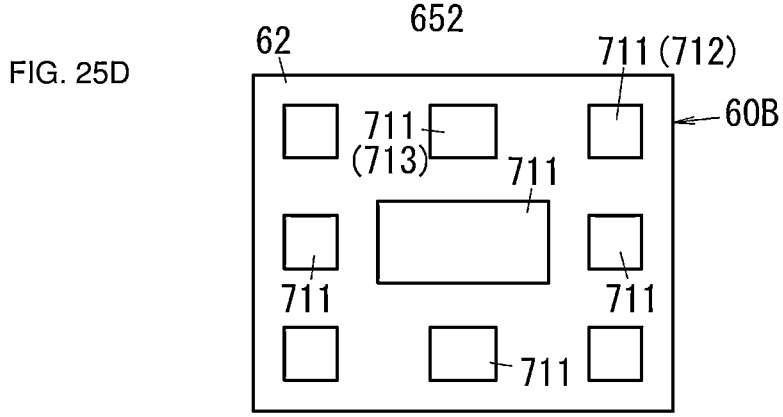
FIG. 25D illustrates the above mounting substrate, and is a plan view in which a second main surface is seen through from a side of a first main surface of the mounting substrate.

As illustrated in FIG. 22 and FIG. 23, a layout of the first filter 11, the second filter 12, and a plurality of the electronic components 16 disposed on the mounting substrate 60B is different from that of the high-frequency module 1A according to Preferred Embodiment 2.

In the high-frequency module 1B, the mounting substrate 60B has, for example, a rectangular or substantially rectangular shape in plan view from the thickness direction D1 of the mounting substrate 60B. In the high-frequency module 1B, in plan view from the thickness direction D1 of the mounting substrate 60B, the first filter 11 is spaced away from four corner portions of the first main surface 61 of the mounting substrate 60B. In the following description, for convenience of description, in plan view from the thickness direction D1 of the mounting substrate 60B, with respect to the four corner portions of the first main surface 61 of the mounting substrate 60B, an upper right corner portion in FIG. 22 is referred to as a first corner portion, an upper left corner portion is referred to as a second corner portion, a lower left corner portion is referred to as a third corner portion, and a lower right corner portion is referred to as a fourth corner portion.

In the high-frequency module 1B, the second input/output terminal 102 and the ground terminal 103 (103b) of the first filter 11 are provided, in a vicinity of one long side (a long side between the first corner portion and the second corner portion) of two long sides of the mounting substrate 60B, in a direction along this long side. In addition, in the high-frequency module 1B, the second input/output terminal 102 and the ground terminal 103 (103a) are provided, in a vicinity of one short side (a short side between the first corner portion and the fourth corner portion) of two short sides of the mounting substrate 60B, in a direction along this short side.

In the mounting substrate 60B, the input/output terminal 712 (external connection terminal 711) is disposed at a corner portion, of four corner portions of the second main surface 62 of the mounting substrate 60B, that overlaps the first corner portion of the first main surface 61 in the thickness direction D1 of the mounting substrate 60B. Accordingly, in the thickness direction D1 of the mounting substrate 60B, the second input/output terminal 102 of the first filter 11 does not overlap the input/output terminal 712.

In the high-frequency module 1B, as illustrated in FIG. 24 and FIGS. 25A to 25C, the second wiring portion 642 includes two wiring via conductors 6421, 6423 disposed along the thickness direction D1 of the mounting substrate 60B, and an inner layer conductive portion 6422 disposed along a plane orthogonal or substantially orthogonal to the thickness direction D1 of the mounting substrate 60B. In the high-frequency module 1B, the second land electrode 672 is connected to the wiring via conductor 6421, the wiring via conductor 6421 is connected to the inner layer conductive portion 6422, the inner layer conductive portion 6422 is connected to the wiring via conductor 6423, and the wiring via conductor 6423 is connected to the input/output terminal 712 (see FIG. 24 and FIG. 25D). In the high-frequency module 1A according to Preferred Embodiment 2, the second wiring portion 642 has, for example, a linear or substantially linear shape, whereas in the high-frequency module 1B according to Modified Example 3, the second wiring portion 642 has, for example, a crank or substantially crank shape.

The mounting substrate 60B further includes a second ground layer 663 that is different from the ground layer 660 (hereinafter, also referred to as a first ground layer 660). The second ground layer 663 is disposed between the first main surface 61 of the mounting substrate 60B and the inner layer conductive portion 6422. The second ground layer 663 overlaps the inner layer conductive portion 6422 in plan view from the thickness direction D1 of the mounting substrate 60B. The second ground layer 663 also overlaps the input/output terminal 712 in plan view from the thickness direction D1 of the mounting substrate 60B.

In the high-frequency module 1B according to Modified Example 3, similarly to the high-frequency module 1A according to Preferred Embodiment 2, a plurality of the via conductors 645 are located between the first land electrode 671 and the second land electrode 672 in plan view from the thickness direction D1 of the mounting substrate 60B. Accordingly, with the high-frequency module 1B according to Modified Example 3, filter characteristics of the first filter 11 can be improved.

Further, since the high-frequency module 1B according to Modified Example 3 includes the second ground layer 663, isolation between the second wiring portion 642 and the first wiring portion 641 can be improved, and isolation between the first input/output terminal 101 and the second input/output terminal 102 of the first filter 11 can be improved.

The high-frequency module 1B according to Modified Example 3, for example, can be used instead of the high-frequency module 1 included in the communication device 500 illustrated in FIG. 1.

Figure 26:
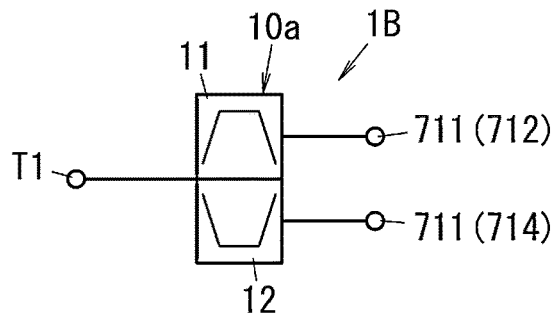
FIG. 26 is a circuit diagram of a filter according to another modified example of Modified Example 3 of Preferred Embodiment 2 of the present invention.

The high-frequency module 1B according to another modified example of Modified Example 3 will be described with reference to FIG. 26. The high-frequency module 1B according to the other modified example is different from the high-frequency module 1B according to Modified Example 3 in that a plurality of the electronic components 16 are not provided. In addition, in the high-frequency module 1B according to Modified Example 3, a multiplexer is a triplexer, whereas in the high-frequency module 1B according to the modified example of Modified Example 3, a multiplexer is a diplexer including the first filter 11 and the second filter 12. The high-frequency module 1B according to the modified example of Modified Example 3, for example, can be used instead of the high-frequency module 1 included in the communication device 500 according to Preferred Embodiment 1 illustrated in FIG. 1. In this case, the communication device 500 does not include the third processing unit 40.

5.4. Modified Example 4

Figure 27:
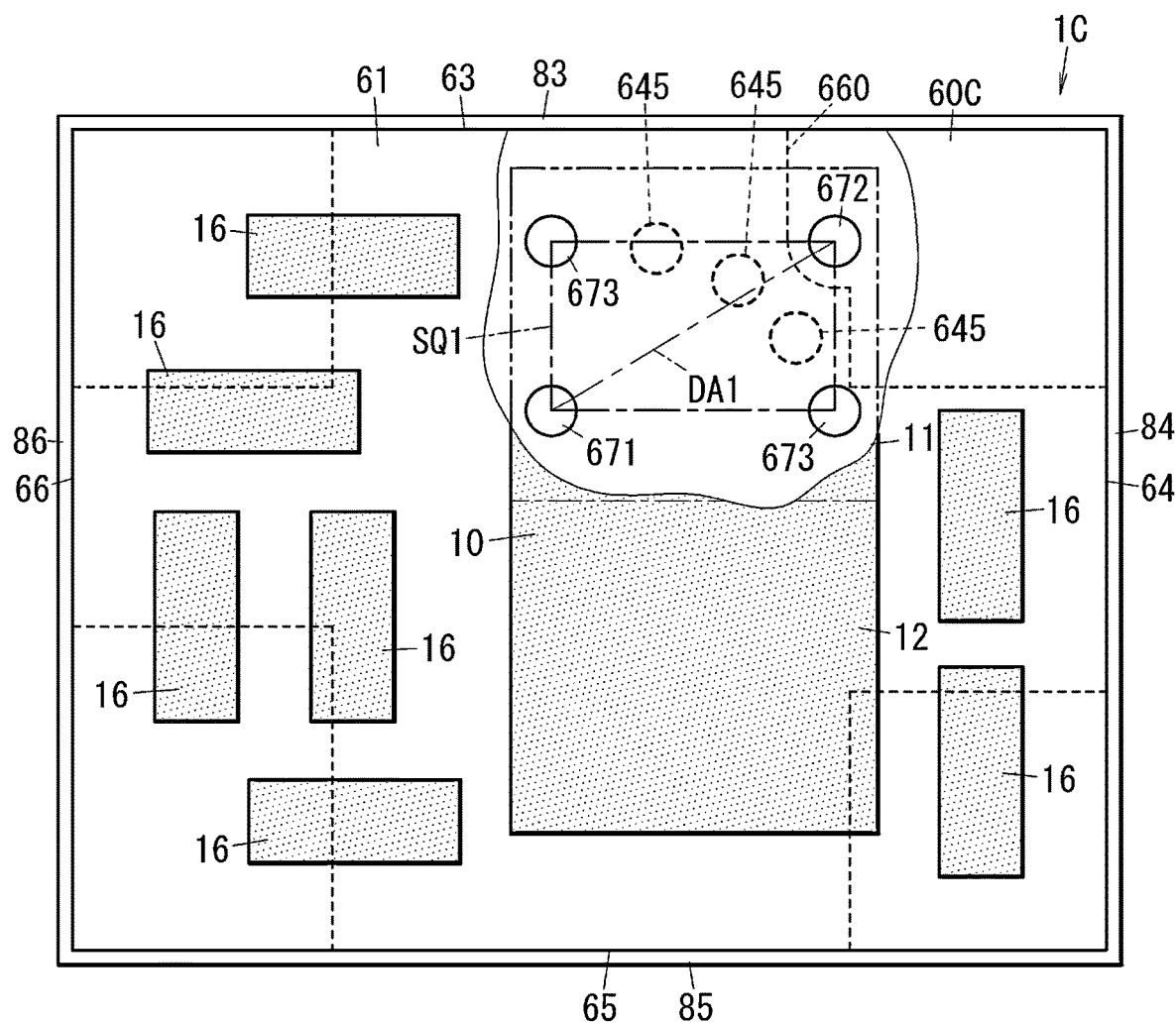
FIG. 27 is a partially broken plan view of a mounting substrate included in a high-frequency module according to Modified Example 4 of the Embodiment 2 of the present invention.
Figure 28:
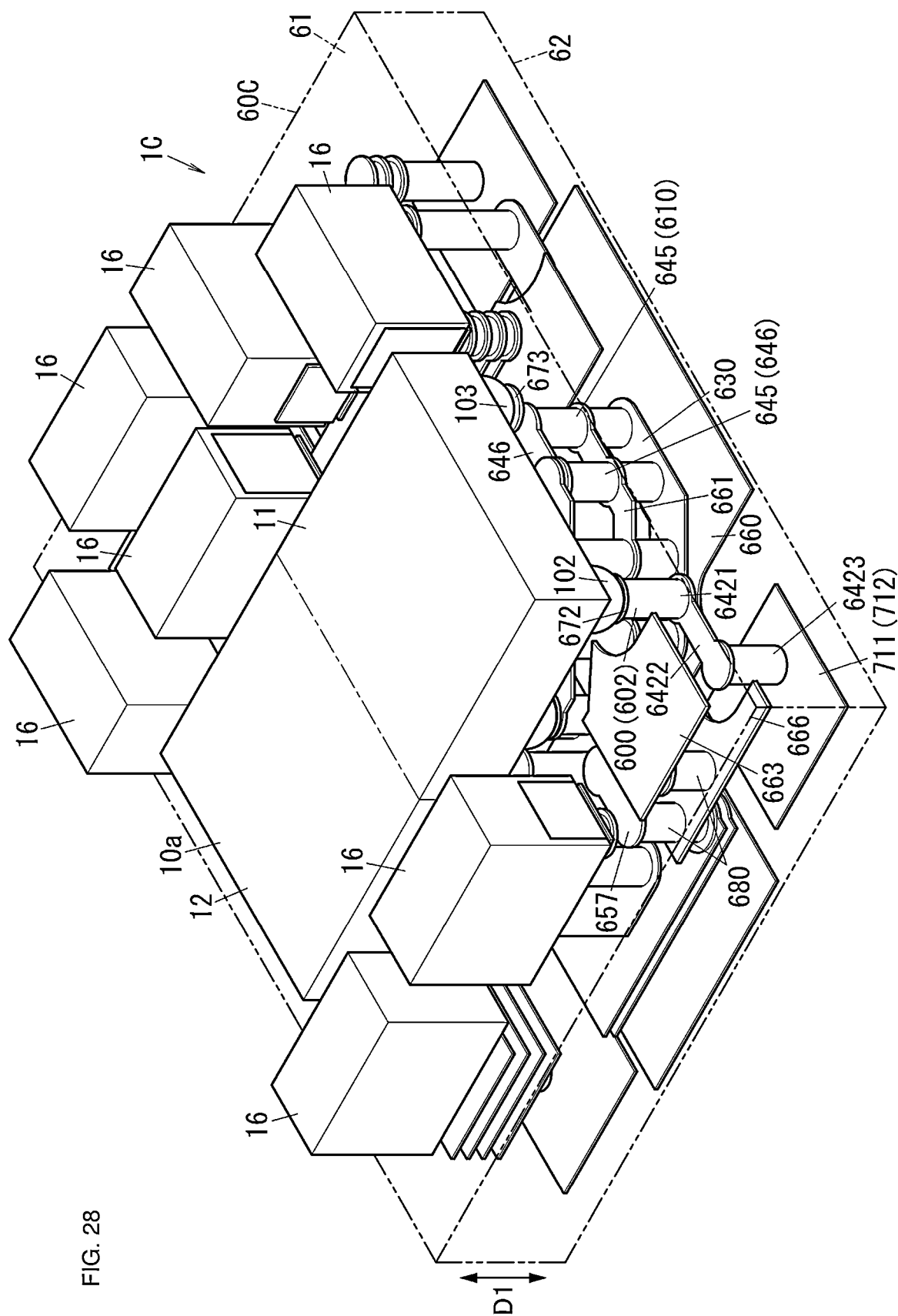
FIG. 28 is a partially transparent perspective view of the above mounting substrate.

A high-frequency module 1C according to Modified Example 4 of Preferred Embodiment 2 of the present invention will be described with reference to FIG. 27 and FIG. 28. The high-frequency module 1C according to Modified Example 4 is different from the high-frequency module 1B according to Modified Example 3 in that a mounting substrate 60C is provided, instead of the mounting substrate 60B in the high-frequency module 1B according to Modified Example 3. With respect to the high-frequency module 1C according to Modified Example 4, the same or similar components to those of the high-frequency module 1B according to Modified Example 3 are denoted by the same reference numerals, and the description thereof will be omitted.

The mounting substrate 60C includes four side surfaces 63, 64, 65, and 66 connecting the first main surface 61 and the second main surface 62. In the mounting substrate 60C, a size of the ground layer 660 is larger than that of the mounting substrate 60B, and an outer peripheral edge of the ground layer 660 extends to the four side surfaces 63, 64, 65, and 66. The high-frequency module 1C further includes two side surface ground layers 83 and 84 that are respectively disposed on the two side surfaces 63 and 64, of the four side surfaces 63, 64, 65, and 66, close to the second wiring portion 642, and are connected to the ground layer 660.

Further, the high-frequency module 1C further includes two side surface ground layers 85 and 86 respectively disposed on the side surfaces 65 and 66 and connected to the ground layer 660.

In the high-frequency module 1C according to Modified Example 4, similarly to the high-frequency module 1A according to Preferred Embodiment 2, a plurality of the via conductors 645 are located between the first land electrode 671 and the second land electrode 672 in plan view from the thickness direction D1 of the mounting substrate 60C. Accordingly, with the high-frequency module 1C according to Modified Example 4, filter characteristics of the first filter 11 can be improved.

Further, the high-frequency module 1C according to Modified Example 4 further includes the two side surface ground layers 83 and 84 that are respectively disposed on the two side surfaces 63 and 64 close to the second wiring portion 642 and are connected to the ground layer 660, and thus it is possible to improve isolation between the first input/output terminal 101 and the second input/output terminal 102.

The high-frequency module 1C according to Modified Example 4, for example, can be used instead of the high-frequency module 1 included in the communication device 500 illustrated in FIG. 1.

5.5. Modified Example 5

Figure 29:
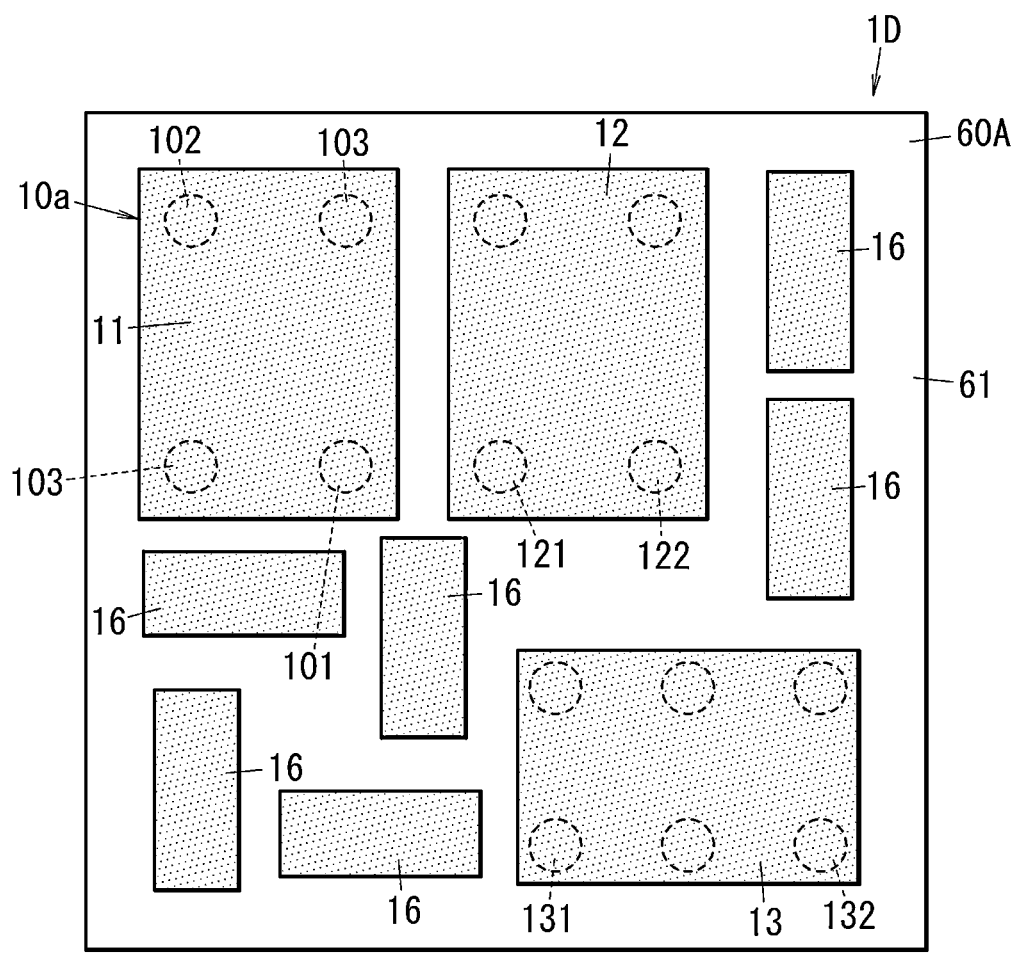
FIG. 29 is a plan view of a mounting substrate included in a high-frequency module according to Modified Example 5 of Preferred Embodiment 2 of the present invention.

A high-frequency module 1D according to Modified Example 5 of Preferred Embodiment 2 of the present invention will be described with reference to FIG. 29. With respect to the high-frequency module 1D according to Modified Example 5, the same or similar components to those of the high-frequency module 1A according to Preferred Embodiment 2 are denoted by the same reference numerals, and the description thereof will be omitted. Note that, the high-frequency module 1D according to Modified Example 5, for example, can be used instead of the high-frequency module 1A of the communication device 500 according to Preferred Embodiment 2.

The high-frequency module 1D according to Modified Example 5 differs from the high-frequency module 1 according to Preferred Embodiment 1 in that the first filter 11 and the second filter 12 are not provided as one package and are separate from each other.

In the high-frequency module 1D according to Modified Example 5, not only filter characteristics of the first filter 11 can be improved, but also a degree of freedom in the configuration of the first filter 11 and the second filter 12 is increased.

Note that, the high-frequency module 1D according to Modified Example 5, for example, may be used instead of the high-frequency module 1 of the communication device 500 according to Preferred Embodiment 1.

Other Modified Examples

Each of the Preferred Embodiments 1 to 2 and the modified examples described above is only one of various preferred embodiments of the present invention. As long as the advantageous effects of preferred embodiments of the present invention can be achieved, various modifications can be made according to the design and the like in Preferred Embodiments 1 to 2 and the respective modified examples described above.

Further, the first filter 11, the second filter 12, and the third filter 13 are, for example, acoustic wave filters that utilize surface acoustic waves, but the present invention is not limited thereto, and for example, an acoustic wave filter that utilizes boundary acoustic waves, plate waves, or the like, for example, may be used.

The first filter 11 may be a bare chip that does not have a package structure. Further, the first filter 11 is not limited to the acoustic wave filter utilizing a surface acoustic wave, and may be, for example, a BAW filter. Further, the first filter 11 is not limited to the ladder filter, and may be, for example, a longitudinally coupled resonator surface acoustic wave filter.

The piezoelectric substrate 115 of the first filter 11 is not limited to the piezoelectric substrate, and may be, for example, a laminated substrate including a piezoelectric layer.

The laminated substrate includes, for example, a support substrate, a low-acoustic-velocity film provided on the support substrate, and a piezoelectric layer provided on the low-acoustic-velocity film.

The support substrate includes a first main surface and a second main surface facing each other. The low-acoustic-velocity film is provided on the first main surface of the support substrate.

A material of the piezoelectric layer is preferably, for example, lithium tantalate or lithium niobate. The low-acoustic-velocity film is a film in which acoustic velocity of a bulk wave propagating through the low-acoustic-velocity film is lower than acoustic velocity of a bulk wave propagating through the piezoelectric layer. A material of the low-acoustic-velocity film is preferably, for example, silicon oxide. The material of the low-acoustic-velocity film is not limited to silicon oxide. The material of the low-acoustic-velocity film may be, for example, silicon oxide, glass, silicon oxynitride, tantalum oxide, a compound obtained by adding fluorine, carbon, or boron to silicon oxide, or a material including the respective above-described materials as main components. In the support substrate, the acoustic velocity of a bulk wave propagating through the support substrate is higher than the acoustic velocity of an acoustic wave propagating through the piezoelectric layer. Here, the bulk wave propagating through the support substrate is a bulk wave having the lowest acoustic velocity of a plurality of bulk waves propagating through the support substrate. It is sufficient that, for example, a material of the support substrate includes at least one material selected from the group consisting of silicon, aluminum nitride, aluminum oxide, silicon carbide, silicon nitride, sapphire, lithium tantalate, lithium niobate, quartz, alumina, zirconia, cordierite, mullite, steatite, forsterite, magnesia, and diamond.

The laminated substrate may further include a high-acoustic-velocity film provided between the support substrate and the low-acoustic-velocity film. The high-acoustic-velocity film is a film in which acoustic velocity of a bulk wave propagating through the high-acoustic-velocity film is higher than acoustic velocity of an acoustic wave propagating through the piezoelectric layer. A material of the high-acoustic-velocity film is preferably, for example, at least one material, for example, selected from the group consisting of diamond-like carbon, aluminum nitride, aluminum oxide, silicon carbide, silicon nitride, silicon, sapphire, a piezoelectric body (lithium tantalate, lithium niobate, or quartz), alumina, zirconia, cordierite, mullite, steatite, forsterite, magnesia, and diamond. The material of the high-acoustic-velocity film may be a material including any of the materials described above as a main component, or a material including a mixture of any of the above-described materials as a main component.

The laminated substrate may include, for example, an adhesion layer interposed between the low-acoustic-velocity film and the piezoelectric layer. The adhesion layer is preferably made of, for example, resin (epoxy resin, polyimide resin). Further, the laminated substrate may include a dielectric film between the low-acoustic-velocity film and the piezoelectric layer, on the piezoelectric layer, or below the low-acoustic-velocity film. A material of the dielectric film is preferably, for example, silicon oxide. Further, the first filter 11 may further include a protective film that is provided on the piezoelectric substrate 115 and covers a plurality of the IDT electrodes 116. A material of the protective film is preferably, for example, silicon oxide.

It is sufficient that the high-frequency module 1 (1A) includes at least the mounting substrate 60 (60A) and the first filter 11, and the second filter 12 and the third filter 13 are not necessary.

Further, it is sufficient that the high-frequency module 1 (1A) includes one of a transmission path including a power amplifier and a reception path including a low-noise amplifier in the first processing unit 20, and the second processing unit 30 and a third processing unit are not essential.

As described above, a high-frequency module (1, 1A, 1B, 1C; 1D) according to a preferred embodiment of the present invention includes a mounting substrate (60, 60A, 60B, 60C), a filter (for example, the first filter 11), and a common inductor (L1). The mounting substrate (60, 60A, 60B, 60C) includes a first main surface (61) and a second main surface (62) facing each other. The filter includes a plurality of series arm resonators (104) and a plurality of parallel arm resonators (105), and is disposed on the first main surface (61). The mounting substrate (60) includes a ground terminal (713) on the second main surface (62). A first end of the common inductor (L1) is connected to all of the plurality of parallel arm resonators (105). A second end of the common inductor (L1) is connected to the ground terminal (713).

According to this configuration, it is possible to improve filter characteristics.

In a high-frequency module (1, 1A, 1B, 1C, 1D) according to a preferred embodiment of the present invention, the common inductor (L1) includes a via conductor (650) provided on the mounting substrate (60, 60A, 60B, 60C). A first end of the via conductor (650) is connected to all of the plurality of parallel arm resonators (105). A second end of the via conductor (650) is connected to the ground terminal (713).

According to this configuration, all of the plurality of parallel arm resonators (105) can be connected to the ground terminal (713) with the one via conductor (650) interposed therebetween.

In a high-frequency module (1, 1A, 1B, 1C, 1D) according to a preferred embodiment of the present invention, the common inductor (L1) further includes a second via conductor (for example, the via conductor 651) different from a first via conductor as the via conductor (650) and a wiring portion (for example, the second wiring portion 655) that are provided in the mounting substrate (60, 60A, 60B, 60C). The second end of the first via conductor is connected to a first end of the second via conductor with the wiring portion interposed therebetween. A second end of the second via conductor is connected to the ground terminal (713).

According to this configuration, the first via conductor, which is the via conductor (650), can be connected to the ground terminal (713) with the second via conductor and the wiring portion (second wiring portion 655) interposed therebetween.

In a high-frequency module (1, 1A, 1B, 1C, 1D) according to a preferred embodiment of the present invention, an inductor (L10) connected in series to the one parallel arm resonator (105) of a plurality of the parallel arm resonators (105) is further provided. The inductor (L10) is disposed on a path (for example, the second path 107) between an end portion of the one parallel arm resonator (105) that is an end portion connected on a path (for example, the first path 106) to which the plurality of series arm resonators (104) is connected, and a first end of the common inductor (L1).

According to this configuration, even when the inductor (L10) connected in series to the one parallel arm resonator (105) of the plurality of parallel arm resonators (105) is further provided, it is possible to reduce or prevent deterioration in quality of communication using a signal passing through the filter. Further, by providing the inductor (L10), it is possible to further improve the filter characteristics of the filter.

In a high-frequency module (1, 1A, 1B, 1C, 1D) according to a preferred embodiment of the present invention, an inductor (L11) is further provided. The inductor (L11) is connected in series to the two or more parallel arm resonators (105) of the parallel arm resonators (105) remaining after excluding the one parallel arm resonator (105) from a plurality of the parallel arm resonators (105). The inductor (L11) is disposed on a path between respective end portions of the above two or more parallel arm resonators (105) that are end portions respectively connected on a path (for example, the first path 106) to which the plurality of series arm resonators (104) is connected, and the first end of the common inductor (L1).

According to this configuration, even when the inductor (L11) connected in series to the two or more parallel arm resonators (105) of the parallel arm resonators (105) remaining after excluding the one parallel arm resonator (105) from the plurality of parallel arm resonators (105) is provided, it is possible to reduce or prevent deterioration in quality of communication using a signal passing through the filter. Further, by providing the inductor (L11), it is possible to further improve filter characteristics of the filter.

A high-frequency module (1, 1A, 1B, 1C, 1D) according to a preferred embodiment of the present invention includes the mounting substrate (60, 60A, 60B, 60C) and the filter (the first filter 11). The mounting substrate (60) includes the first main surface (61) and the second main surface (62) facing each other. The filter includes the first input/output terminal (101), the second input/output terminal (102), and a plurality of the ground terminals (103), and is disposed on the first main surface (61) of the mounting substrate (60, 60A, 60B, 60C). The mounting substrate (60, 60A, 60B, 60C) includes the ground terminal (713) on the second main surface (62), and has the via conductor (650) between the first main surface (61) and the second main surface (62). The first end of the via conductor (650) is connected to all of the plurality of ground terminals (103). The second end of the via conductor (650) is connected to the ground terminal (713).

According to this configuration, it is possible to improve the filter characteristics.

In a high-frequency module (1, 1A, 1B, 1C, 1D) according to a preferred embodiment of the present invention, the mounting substrate (60, 60A, 60B, 60C) further includes another via conductor (651) that is different from the via conductor (650), and the wiring portion (for example, the second wiring portion 655), between the first main surface (61) and the second main surface (62). The second end of the via conductor (650) is connected to a first end of the other via conductor (651) with the wiring portion interposed therebetween. A second end of the other via conductor (651) is connected to the ground terminal (713).

According to this configuration, the via conductor (650) can be connected to the ground terminal (713) with the other via conductor (651) and the wiring portion (second wiring portion 655) interposed therebetween.

In a high-frequency module (1A, 1B, 1C, 1D) according to a preferred embodiment of the present invention, the mounting substrate (60A, 60B, 60C) further includes a first land electrode (671), a second land electrode (672), and a plurality of the second via conductors (for example, the via conductors 645). The first land electrode (671) is connected to the first input/output terminal (101). The second land electrode (672) is connected to the second input/output terminal (102). The plurality of second via conductors are disposed between the first main surface (61) and the second main surface (62), and is different from the first via conductor as the via conductor (650). The plurality of second via conductors are connected to the ground terminal (713). The plurality of second via conductors is located between the first land electrode (671) and the second land electrode (672) in plan view from a thickness direction (D1) of the mounting substrate (60, 60A, 60B, 60C).

According to this configuration, it is possible to improve the filter characteristics.

In a high-frequency module (1A, 1B, 1C, 1D) according to a preferred embodiment of the present invention, the filter includes a band pass filter (for example, the first filter 11) having a predetermined pass band.

In a high-frequency module (1A, 1B, 1C, 1D) according to a preferred embodiment of the present invention, the predetermined pass band corresponds to a frequency band in a 2.4 GHz band for Wi-Fi (registered trademark).

In a high-frequency module (1A, 1B, 1C, 1D) according to a preferred embodiment of the present invention, the filter is a ladder filter including a plurality of the series arm resonators (104) and a plurality of the parallel arm resonators (105).

According to this configuration, it is possible to improve attenuation characteristics.

In a high-frequency module (1A, 1B, 1C, 1D) according to a preferred embodiment of the present invention, an inductor (L10) connected in series to the one parallel arm resonator (105) of the plurality of parallel arm resonators (105) is further provided. The inductor (L10) is disposed on a path (for example, the second path 107) between an end portion of the above one parallel arm resonator (105) that is an end portion connected on a path (for example, the first path 106) to which the plurality of series arm resonators (104) is connected, and the first end of the via conductor (650).

According to this configuration, even when the inductor (L10) connected in series to the one parallel arm resonator (105) of the plurality of parallel arm resonators (105) is further provided, it is possible to reduce or prevent deterioration in quality of communication using a signal passing through the filter. Further, by providing the inductor (L10), it is possible to further improve the filter characteristics of the filter.

In a high-frequency module (1A, 1B, 1C, 1D) according to a preferred embodiment of the present invention, an inductor (L11) is further provided. The inductor (L11) is connected in series to the two or more parallel arm resonators (105) of the parallel arm resonators (105) remaining after excluding the one parallel arm resonator (105) from a plurality of the parallel arm resonators (105). The inductor (L11) is disposed on a path between respective end portions of the two or more parallel arm resonators (105) that are end portions respectively connected on a path (for example, the first path 106) to which the plurality of series arm resonators (104) is connected, and the first end of the via conductor (650).

According to this configuration, even when the inductor (L11) connected in series to the two or more parallel arm resonators (105) of the parallel arm resonators (105) remaining after excluding the one parallel arm resonator (105) from the plurality of parallel arm resonators (105) is provided, it is possible to reduce or prevent deterioration in quality of communication using a signal passing through the filter. Further, by providing the inductor (L11), it is possible to further improve filter characteristics of the filter.

In a high-frequency module (1A, 1B, 1C, 1D) according to a preferred embodiment of the present invention, a second filter (12) separate from the first filter (11) is further included. The second filter 12 is a filter having a pass band on at least one of a higher frequency side and a lower frequency side of the above predetermined pass band.

According to this configuration, when used as a multiplexer including the first filter (11) and the second filter (12), it is possible to reduce or prevent influence of filter characteristic of the first filter (11) on filter characteristics of the second filter (12).

In a high-frequency module (1A, 1B, 1C, 1D) according to a preferred embodiment of the present invention, a third filter (13) is further provided. The third filter (13) has a pass band on a higher frequency side or a lower frequency side than the predetermined pass band of the filter (the first filter 11) and the pass band of the second filter (12).

According to this configuration, when used as a multiplexer including the first filter (11), the second filter (12), and the third filter (13), it is possible to reduce or prevent influence of filter characteristic of the first filter (11) on filter characteristics of the respective second filter (12) and the third filter (13).

In a high-frequency module (1A, 1B, 1C, 1D) according to a preferred embodiment of the present invention, a distance between the two second via conductors adjacent to each other of the plurality of second via conductors is equal to or less than about one quarter of a wavelength of a radio wave at a center frequency of a predetermined pass band.

According to this configuration, it is possible to improve isolation between the first input/output terminal (101) and the second input/output terminal (102) of the filter.

In a high-frequency module (1A, 1B, 1C, 1D) according to a preferred embodiment of the present invention, the mounting substrate (60A, 60B, 60C) has a polygonal or substantially polygonal shape in plan view from the thickness direction (D1). In the mounting substrate (60A, 60B, 60C), one land electrode of the first land electrode (671) and the second land electrode (672) is disposed at a corner portion (60a) of the first main surface (61) of the mounting substrate (60A, 60B, 60C) in plan view from the thickness direction (D1).

According to this configuration, one land electrode, of the first land electrode (671) and the second land electrode (672), disposed at the corner portion (60a) of the first main surface (61) of the mounting substrate (60A, 60B, 60C) is less likely to be electromagnetically coupled to another land electrode.

In a high-frequency module (1A, 1B, 1C, 1D) according to a preferred embodiment of the present invention, the mounting substrate (60A, 60B, 60C) further includes a first wiring portion (641) connected to the first land electrode (671) and a second wiring portion (642) connected to the second land electrode (672). The plurality of second via conductors is located between the first wiring portion (641) and the second wiring portion (642) in plan view from the thickness direction (D1) of the mounting substrate (60A, 60B, 60C).

According to this configuration, it is possible to reduce or prevent electromagnetic field coupling between the first wiring portion (641) and the second wiring portion (642) by the plurality of second via conductors, and it is possible to further improve the filter characteristics.

In a high-frequency module (1A, 1B, 1C, 1D) according to a preferred embodiment of the present invention, at least a portion of the first wiring portion (641) is located between the first main surface (61) and the second main surface (62) of the mounting substrate (60A, 60B, 60C). At least a portion of the second wiring portion (642) is located between the first main surface (61) and the second main surface (62) of the mounting substrate (60A, 60B, 60C).

According to this configuration, it is possible to improve the filter characteristics of the filter.

In a high-frequency module (1A, 1B, 1C, 1D) according to a preferred embodiment of the present invention, the mounting substrate (60A, 60B, 60C) further includes a ground layer (660) connected to the plurality of second via conductors and the ground terminal (713). The ground layer (660) is located between the plurality of second via conductors and the ground terminal (713) in the thickness direction (D1). The ground layer (660) overlaps the plurality of second via conductors and the ground terminal (713) in plan view from the thickness direction (D1).

According to this configuration, it is possible to increase a sectional area of a cross-section orthogonal or substantially orthogonal to the thickness direction (D1) of the mounting substrate (60A, 60B, 60C), of the ground layer (660) to which ground potential is applied. This makes it possible to reduce a resistance value of the ground layer, and to reduce or prevent fluctuation in potential of the ground terminal (713).

In a high-frequency module (1A, 1B, 1C, 1D) according to a preferred embodiment of the present invention, in plan view from the thickness direction (D1), an area of the ground layer (660) is larger than an area of the filter.

According to this configuration, it is possible to improve the filter characteristics.

In a high-frequency module (1C) according to a preferred embodiment of the present invention, the second wiring portion (642) includes wiring via conductors (6421, 6423) disposed along the thickness direction (D1), and an inner layer conductive portion (6422) disposed along a plane orthogonal or substantially orthogonal to the thickness direction (D1). The mounting substrate (60C) further includes a second ground layer (663) different from a first ground layer that is the ground layer (660). The second ground layer (663) is disposed between the first main surface (61) and the inner layer conductive portion (6422). The second ground layer (663) overlaps the inner layer conductive portion (6422) in plan view from the thickness direction (D1).

According to this configuration, it is possible to improve isolation between the second wiring portion (642) and the first wiring portion (641), and to improve isolation between the first input/output terminal (101) and the second input/output terminal (102) of the filter (the first filter 11).

In a high-frequency module (1C) according to a preferred embodiment of the present invention, the mounting substrate (60C) has four side surfaces (63, 64, 65, 66) connecting the first main surface (61) and the second main surface (62). The high-frequency module (1C) further includes two side surface ground layers (83, 84) that are respectively disposed on two side surfaces (63, 64) close to the second wiring portion (642) of the four side surfaces (63, 64, 65, 66), and are connected to the ground layer (660).

According to this configuration, it is possible to further improve the isolation between the first input/output terminal (101) and the second input/output terminal (102) of the filter (the first filter 11).

In a communication device (500) according to a preferred embodiment of the present invention, the high-frequency module (1) according to a preferred embodiment of the present invention, and a signal processing circuit (3) that processes a high-frequency signal passing through the high-frequency module (1; 1A; 1B; 1C; 1D) are provided.

According to this configuration, it is possible to reduce or prevent deterioration in quality of communication using a signal passing through the filter.

In a high-frequency module (1A, 1B, 1C, 1D) according to a preferred embodiment of the present invention, the mounting substrate (60A, 60B, 60C) further includes a first land electrode (671), a second land electrode (672), and a plurality of second via conductors (for example, the via conductors 645). The first land electrode (671) is connected to the first input/output terminal (101). The second land electrode (672) is connected to the second input/output terminal (102). The plurality of second via conductors are disposed between the first main surface (61) and the second main surface (62). The plurality of second via conductors are connected to the ground terminal (713). The plurality of second via conductors are located between the first land electrode (671) and the second land electrode (672) in plan view from the thickness direction (D1) of the mounting substrate (60A; 60B; 60C).

According to this configuration, it is possible to improve the filter characteristics.

In a high-frequency module (1A, 1B, 1C, 1D) according to a preferred embodiment of the present invention, the filter includes a band pass filter (for example, the first filter 11) having a predetermined pass band.

In a high-frequency module (1A, 1B, 1C, 1D) according to a preferred embodiment of the present invention, the predetermined pass band corresponds to a frequency band in the 2.4 GHz band for Wi-Fi (registered trademark).

In a high-frequency module (1A, 1B, 1C, 1D) according to a preferred embodiment of the present invention, the band pass filter is a ladder filter including a plurality of the series arm resonators (104) and a plurality of the parallel arm resonators (105).

According to this configuration, it is possible to improve the attenuation characteristics.

In a high-frequency module (1A, 1B, 1C, 1D) according to a preferred embodiment of the present invention, a second filter (12) separate from the first filter (11) is further included. The second filter 12 has a pass band on at least one of a higher frequency side and a lower frequency side of the above predetermined pass band.

According to this configuration, when used as a multiplexer including the first filter (11) and the second filter (12), it is possible to reduce or prevent influence of filter characteristic of the first filter (11) on filter characteristics of the second filter (12).

In a high-frequency module (1A, 1B, 1C, 1D) according to a preferred embodiment of the present invention, a third filter (13) is further provided. The third filter (13) has a pass band on a higher frequency side or a lower frequency side than the predetermined pass band of the filter (the first filter 11) and the pass band of the second filter (12).

According to this configuration, when used as a multiplexer including the first filter (11), the second filter (12), and the third filter (13), it is possible to reduce or prevent influence of filter characteristic of the first filter (11) on filter characteristics of the respective second filter (12) and the third filter (13).

In a high-frequency module (1A, 1B, 1C, 1D) according to a preferred embodiment of the present invention, a distance between the two second via conductors adjacent to each other of the plurality of second via conductors is equal to or less than about one quarter of a wavelength of a radio wave at a center frequency of a predetermined pass band.

According to this configuration, it is possible to improve the isolation between the first input/output terminal (101) and the second input/output terminal (102) of the filter.

In a high-frequency module (1A, 1B, 1C, 1D) according to a preferred embodiment of the present invention, the mounting substrate (60A, 60B, 60C) has a polygonal or substantially polygonal shape in plan view from the thickness direction (D1). In the mounting substrate (60A, 60B, 60C), one land electrode of the first land electrode (671) and the second land electrode (672) is disposed at a corner portion (60a) of the first main surface (61) of the mounting substrate (60A, 60B, 60C) in plan view from the thickness direction (D1).

According to this configuration, one land electrode, of the first land electrode (671) and the second land electrode (672), disposed at the corner portion (60*a*) of the first main surface (61) of the mounting substrate (60A, 60B, 60C) is less likely to be electromagnetically coupled to another land electrode.

In a high-frequency module (1A, 1B, 1C, 1D) according to a preferred embodiment of the present invention, the mounting substrate (60A, 60B, 60C) further includes a first wiring portion (641) connected to the first land electrode (671) and a second wiring portion (642) connected to the second land electrode (672). The plurality of second via conductors are located between the first wiring portion (641) and the second wiring portion (642) in plan view from the thickness direction (D1) of the mounting substrate (60A; 60B; 60C).

According to this configuration, it is possible to reduce or prevent electromagnetic field coupling between the first wiring portion (641) and the second wiring portion (642) by the plurality of second via conductors, and it is possible to further improve the filter characteristics.

In a high-frequency module (1A, 1B, 1C, 1D) according to a preferred embodiment of the present invention, at least a portion of the first wiring portion (641) is located between the first main surface (61) and the second main surface (62) of the mounting substrate (60A, 60B, 60C). At least a portion of the second wiring portion (642) is located between the first main surface (61) and the second main surface (62) of the mounting substrate (60).

According to this configuration, it is possible to improve the filter characteristics of the filter.

In a high-frequency module (1A, 1B, 1C, 1D) according to a preferred embodiment of the present invention, the mounting substrate (60A, 60B, 60C) further includes a ground layer (660) connected to the plurality of second via conductors and the ground terminal (713). The ground layer (660) is located between the plurality of second via conductors and the ground terminal (713) in the thickness direction (D1). The ground layer (660) overlaps the plurality of second via conductors and the ground terminal (713) in plan view from the thickness direction (D1).

According to this configuration, it is possible to increase a sectional area of a cross-section orthogonal or substantially orthogonal to the thickness direction (D1) of the mounting substrate (60A, 60B, 60C), of the ground layer (660) to which ground potential is applied. This makes it possible to reduce a resistance value of the ground layer, and to reduce or prevent fluctuation in potential of the ground terminal (713).

In a high-frequency module (1A, 1B, 1C, 1D) according to a preferred embodiment of the present invention, in plan view from the thickness direction (D1), an area of the ground layer (660) is larger than an area of the filter.

According to this configuration, it is possible to improve the filter characteristics.

In a high-frequency module (1C) according to a preferred embodiment of the present invention, the second wiring portion (642) includes wiring via conductors (6421, 6423) disposed along the thickness direction (D1), and an inner layer conductive portion (6422) disposed along a plane orthogonal or substantially orthogonal to the thickness direction (D1). The mounting substrate (60C) further includes a second ground layer (663) different from a first ground layer that is the ground layer (660). The second ground layer (663) is disposed between the first main surface (61) and the inner layer conductive portion (6422). The second ground layer (663) overlaps the inner layer conductive portion (6422) in plan view from the thickness direction (D1).

According to this configuration, it is possible to improve the isolation between the second wiring portion (642) and the first wiring portion (641), and to improve the isolation between the first input/output terminal (101) and the second input/output terminal (102) of the filter (the first filter 11).

In a high-frequency module (1C) according to a preferred embodiment of the present invention, the mounting substrate (60C) includes four side surfaces (63, 64, 65, 66) connecting the first main surface (61) and the second main surface (62). The high-frequency module (1C) further includes two side surface ground layers (83, 84) that are respectively disposed on two side surfaces (63, 64) close to the second wiring portion (642) of the four side surfaces (63, 64, 65, 66), and are connected to the ground layer (660).

According to this configuration, it is possible to further improve the isolation between the first input/output terminal (101) and the second input/output terminal (102) of the filter (the first filter 11).

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A high-frequency module, comprising:
   a mounting substrate including a first main surface and a second main surface facing each other;
   a filter including a plurality of series arm resonators and a plurality of parallel arm resonators, and disposed on the first main surface; and
   a common inductor; wherein
   the mounting substrate includes a ground terminal on the second main surface;
   a first end of the common inductor is connected to all of the plurality of parallel arm resonators, and a second end of the common inductor is connected to the ground terminal;
   a wiring electrode is connected to all of the plurality of parallel arm resonators and is disposed between ends of the plurality of parallel arm resonators and the common inductor; and
   the wiring electrode is disposed inside of the mounting substrate.

2. The high-frequency module according to claim 1, wherein
   the common inductor includes a via conductor on the mounting substrate; and
   a first end of the via conductor is connected to all of the plurality of parallel arm resonators, and a second end of the via conductor is connected to the ground terminal.

3. The high-frequency module according to claim 2, wherein
   the common inductor further includes a second via conductor and a wiring portion that are provided in the mounting substrate;
   the second end of the first via conductor is connected to a first end of the second via conductor with the wiring portion interposed between the second end of the first via conductor and the first end of the second via conductor; and
   a second end of the second via conductor is connected to the ground terminal.

4. The high-frequency module according to claim 1, further comprising:

an inductor connected in series to one parallel arm resonator of the plurality of parallel arm resonators; wherein the inductor is disposed on a path between an end portion of the one parallel arm resonator, the end portion connected on a path to which the plurality of series arm resonators is connected, and the first end of the common inductor.

5. The high-frequency module according to claim 1, further comprising:

an inductor connected in series to two or more of the plurality of parallel arm resonators and excluding one parallel arm resonator from the plurality of parallel arm resonators; wherein the inductor is disposed on a path between respective end portions of the two or more parallel arm resonators, the end portions respectively connected on a path to which the plurality of series arm resonators is connected, and the first end of the common inductor.

6. A communication device, comprising:

the high-frequency module according to claim 1; and a signal processing circuit configured to process a high-frequency signal passing through the high-frequency module.

7. A high-frequency module, comprising:

a mounting substrate including a first main surface and a second main surface facing each other; and a first filter including a first input/output terminal, a second input/output terminal, and a plurality of ground terminals, and disposed on the first main surface of the mounting substrate; wherein the mounting substrate includes a ground terminal on the second main surface, and a via conductor between the first main surface and the second main surface;

a first end of the via conductor is connected to all of the plurality of ground terminals, and a second end of the via conductor is connected to the ground terminal;

a wiring electrode is connected to all of the plurality of ground terminals and is disposed between the plurality of ground terminals and the via conductor; and the wiring electrode is disposed inside of the mounting substrate.

8. The high-frequency module according to claim 7, wherein the mounting substrate further includes another via conductor, and a wiring portion, between the first main surface and the second main surface;

the second end of the via conductor is connected to a first end of the another via conductor with the wiring portion interposed between the second end of the via conductor and the first end of the other via conductor; and a second end of the another via conductor is connected to the ground terminal.

9. The high-frequency module according to claim 7, wherein the mounting substrate further includes:

a first land electrode connected to the first input/output terminal;

a second land electrode connected to the second input/output terminal;

a ground terminal located on a side of the second main surface in a thickness direction of the mounting substrate; and a plurality of second via conductors between the first main surface and the second main surface; and the plurality of second via conductors are connected to the ground terminal, and located between the first land electrode and the second land electrode in plan view from a thickness direction of the mounting substrate.

10. The high-frequency module according to claim 9, wherein the first filter includes a band pass filter having a predetermined pass band.

11. The high-frequency module according to claim 10, wherein the predetermined pass band corresponds to a frequency band in a 2.4 GHz band for Wi-Fi.

12. The high-frequency module according to claim 10, wherein the first filter is a ladder filter including a plurality of series arm resonators and a plurality of parallel arm resonators.

13. The high-frequency module according to claim 12, further comprising:

an inductor connected in series to one parallel arm resonator of the plurality of parallel arm resonators; wherein the inductor is disposed on a path between an end portion of the one parallel arm resonator, the end portion connected on a path to which the plurality of series arm resonators is connected, and the first end of the via conductor.

14. The high-frequency module according to claim 12, further comprising:

an inductor connected in series to two or more parallel arm resonators of the plurality of parallel arm resonators excluding one parallel arm resonator from the plurality of parallel arm resonators; wherein the inductor is disposed on a path between respective end portions of the two or more parallel arm resonators, the end portions respectively connected on a path to which the plurality of series arm resonators is connected, and the first end of the via conductor.

15. The high-frequency module according to claim 10, further comprising a second filter, separate from the first filter, disposed on the first main surface and having a pass band on at least one of a high frequency side and a low frequency side of the predetermined pass band.

16. The high-frequency module according to claim 15, further comprising a third filter disposed on the first main surface and having a pass band on a higher frequency side or a lower frequency side than the predetermined pass band of the first filter and the pass band of the second filter.

17. The high-frequency module according to claim 10, wherein a distance between two adjacent second via conductors of the plurality of second via conductors is equal to or less than about one quarter of a wavelength of a radio wave at a center frequency of the predetermined pass band.

18. The high-frequency module according to claim 9, wherein the mounting substrate has a polygonal or substantially polygonal shape in plan view from the thickness direction; and one land electrode of the first land electrode and the second land electrode is disposed at a corner portion of the first main surface of the mounting substrate in plan view from the thickness direction.

19. The high-frequency module according to claim 9, wherein the mounting substrate further includes:

a first wiring portion connected to the first land electrode; and a second wiring portion connected to the second land electrode; and the plurality of second via conductors are located between the first wiring portion and the second wiring portion in plan view from the thickness direction of the mounting substrate.

20. The high-frequency module according to claim 19, wherein at least a portion of the first wiring portion is located between the first main surface and the second main surface of the mounting substrate; and at least a portion of the second wiring portion is located between the first main surface and the second main surface of the mounting substrate.

21. The high-frequency module according to claim 19, wherein the mounting substrate further includes a ground layer connected to the plurality of second via conductors and the ground terminal;

the ground layer is located between the plurality of second via conductors and the ground terminal in the thickness direction; and the ground layer overlaps the plurality of second via conductors and the ground terminal in a plan view from the thickness direction.

22. The high-frequency module according to claim 21, wherein in the plan view from the thickness direction, an area of the ground layer is larger than an area of the first filter.

23. The high-frequency module according to claim 21, wherein the second wiring portion includes a via conductor disposed along the thickness direction, and an inner layer conductive portion disposed along a plane orthogonal or substantially orthogonal to the thickness direction;

the mounting substrate further includes a second ground layer;

the second ground layer is disposed between the first main surface and the inner layer conductive portion, and overlaps the inner layer conductive portion, in plan view from the thickness direction.

24. The high-frequency module according to claim 23, wherein the mounting substrate includes four side surfaces connecting the first main surface and the second main surface; and the high-frequency module further includes two side surface ground layers, respectively disposed on two side surfaces adjacent to or in a vicinity of the second wiring portion of the four side surfaces, and connected to the ground layer.

\* \* \* \* \*